United States Patent
Kao et al.

(10) Patent No.: US 9,741,693 B2
(45) Date of Patent: Aug. 22, 2017

(54) SEMICONDUCTOR PACKAGE AND METHOD OF FORMING THE SAME

(71) Applicant: TAIWAN SEMICONDUCTOR MANUFACTURING COMPANY LTD., Hsinchu (TW)

(72) Inventors: Chin-Fu Kao, Taipei (TW); Tsei-Chung Fu, Miaoli County (TW); Jing-Cheng Lin, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/939,253

(22) Filed: Nov. 12, 2015

(65) Prior Publication Data

US 2017/0141079 A1    May 18, 2017

(51) Int. Cl.
H01L 25/065    (2006.01)
H01L 25/00     (2006.01)

(52) U.S. Cl.
CPC .......... *H01L 25/0657* (2013.01); *H01L 25/50* (2013.01); *H01L 2225/06544* (2013.01)

(58) Field of Classification Search
USPC .......................................... 257/621; 438/107
See application file for complete search history.

(56) References Cited

U.S. PATENT DOCUMENTS

| | | | | |
|---|---|---|---|---|
| 4,674,671 A * | 6/1987 | Fister | ................... | B23K 20/007 228/111 |
| 2004/0172813 A1* | 9/2004 | Matsui | .............. | H01L 21/76898 29/830 |
| 2007/0163635 A1* | 7/2007 | Nasuno | ................. | H01L 31/068 136/252 |
| 2015/0076649 A1* | 3/2015 | Kim | .................. | H01L 27/14609 257/446 |

* cited by examiner

*Primary Examiner* — Zandra Smith
*Assistant Examiner* — Lawrence Tynes, Jr.
(74) *Attorney, Agent, or Firm* — WPAT, P.C., Intellectual Property Attorneys; Anthony King

(57) ABSTRACT

The present disclosure provides a semiconductor package, including a first device having a first joining surface, a first conductive component at least partially protruding from the first joining surface, a second device having a second joining surface facing the first joining surface, and a second conductive component at least exposing from the second joining surface. The first conductive component and the second conductive component form a joint having a first beak. The first beak points to either the first joining surface or the second joining surface.

20 Claims, 22 Drawing Sheets

SEMICONDUCTOR PACKAGE AND METHOD OF FORMING THE SAME

BACKGROUND

As feature sizes of integrated circuits continue to shrink to meet performance demands and overall chip dimensions increase, the interconnect structure consumes more of the available power and delay budgets for integrated circuits. As wiring has become more expensive and clock frequencies have increased, designers have investigated three-dimensional integration as a means of reducing signaling across chips.

Three dimensional integrated circuits (3DICs) are a recent development in semiconductor packaging in which multiple semiconductor dies are stacked upon one another, such as package-on-package (PoP) and system-in-package (SiP) packaging techniques. 3DICs provide improved integration density and other advantages, such as faster speeds and higher bandwidth, because of the decreased length of interconnects between the stacked dies, as examples.

3DICs have multiple layers of active components. The active components can be wired to devices on the same and/or different layers. In one approach, multiple conventional wafers are arranged together in a stack with some means of interconnecting the conventional circuits. Wafers can be bonded face-to-face (i.e., such that the metallizations are adjacent), face-to-back (i.e., such that the metallization layers of one wafer face the substrate of a second wafer) or back-to-back (i.e., such that the substrate of one wafer faces the substrate of a second wafer) using interconnects formed in high-aspect-ratio vias through the device area of the upper wafer. Following bonding of the wafers, the stack is packaged.

An improved three-dimensional integration structure and method are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
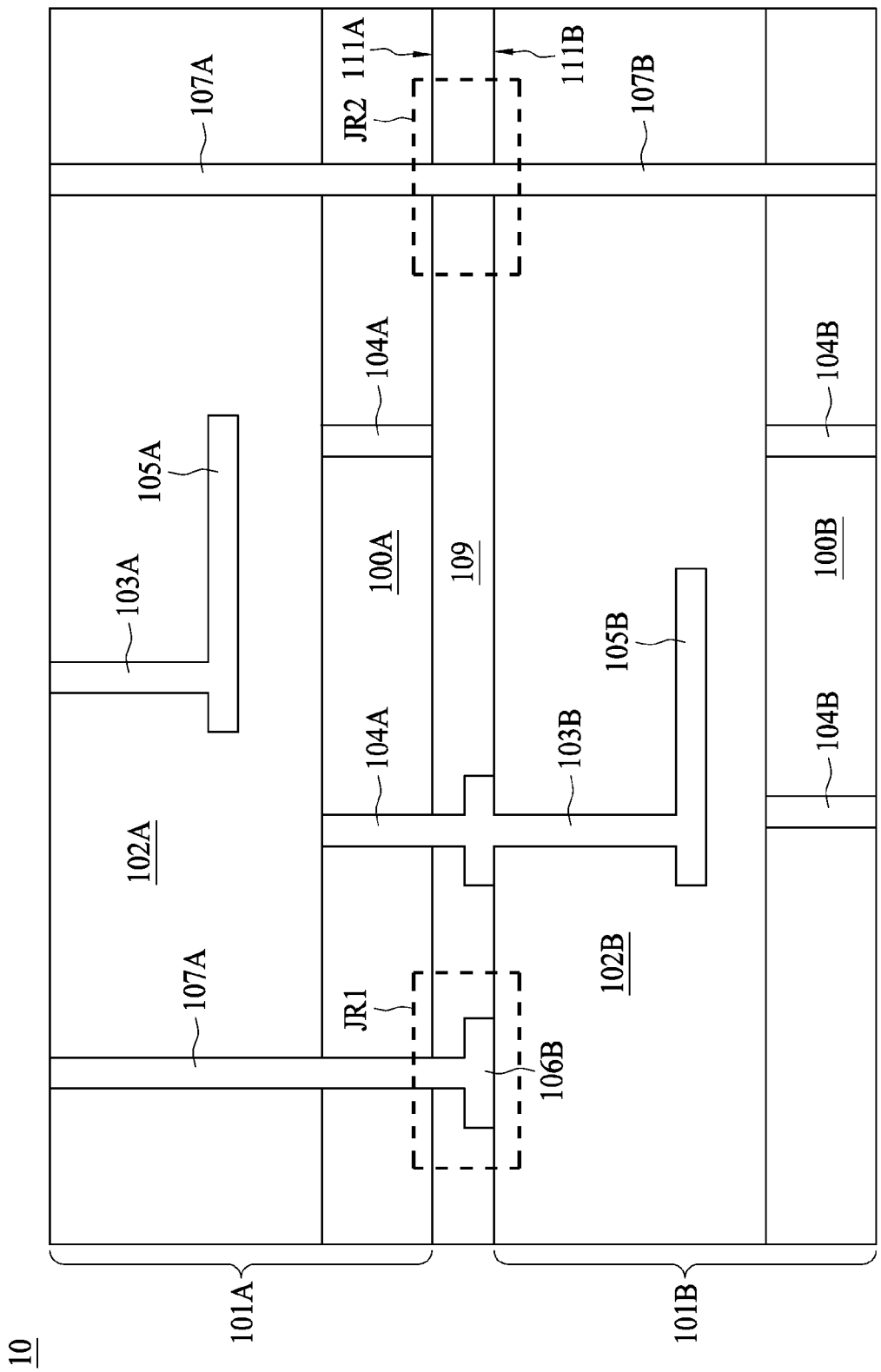
FIG. 1 is a cross section of a semiconductor package, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Presently, there are three bonding schemes for bonding wafers in the three dimensional stack: (i) copper-to-copper bonding, (ii) adhesive bonding and (iii) fusion bonding. In the direct copper bonding scheme, exposed copper pads are bonded together using a high load pressure high temperature, long duration anneal process. For advanced devices with low dielectric constant (low k) materials, this process may induce failure of the low k materials. Adhesive bonding typically employs BCB (BenzoCycloButene), which has a glass transition temperature of 350.degree. C. The bonding material is unstable during subsequent higher temperature processes utilized in completing the device interconnections. Finally, direct oxide bonding (fusion bonding) between two wafers with oxide top layers is a low temperature bonding process. The oxide layers are pretreated with wet treatment or plasma to generate some dangling bonds for OH bonding. By using fusion bonding, deep through via processes need to be performed for vertical interconnects after the bonding process, which requires better bonding alignment accuracy than direct copper bonding.

The aforesaid copper-to-copper bonding faces many challenges to mass production in terms of high density and full array microbumps. The challenges include coplanarity of microbumps, voids trapping and wafer/die warpage. When forming microbump array with (1) each microbump protruding from a top surface of the carrier (i.e., silicon substrate or dielectric layer) or with (2) each microbump surrounded by a dielectric layer, the colanarity between each microbump is crucial since low colanarity is prone to cause cold joint in several shorter microbumps compared to other longer counterparts. One of the causes leading to low coplanarity is that electroplating operation inherently cannot produce a good coplanarity across the wafer because the microbumps located in a center portion of the wafer may turn out to have a shorter height than that of the microbumps located in a peripheral portion of the wafer.

Surface planarization (Fly cut) can be a way to improve the coplanarity over the aforesaid microbumps. A diamond head is employed to a top surface of the microbumps (in some scheme photoresist layer is applied to fill the gaps between adjacent microbumps and baked until it is cross-linked/hardened) and forming new coplanar planes by reducing the lengths of the more prominent microbumps. However, the scratches formed by the diamond head create recesses on the surface of the microbumps and subsequently turning into voids during the joining operation.

Chemical mechanical polishing (CMP) can be another way to improve the coplanarity. However, the chemical etchant possesses different etching rate to different regions of the microbumps. For example, if microbumps have a top view cross section of a circle, the chemical etchant removes a center portion of the microbumps faster than that of a peripheral portion of the microbumps. A dishing structure can occur in individual microbumps, consequently resulting in voids trapping.

Note both the surface planarization (fly cut) and CMP options cannot resolve the coplanarity concern and voids trapping problem. Moreover, the additional cost may be generated due to the application of photoresist or Polybenzoxazole (PBO) for surface planarization operations (i.e., fly cut and CMP).

The present disclosure provides a bonding structure and a method of forming the same. The structure and the method effectively avoid voids trapping and cold joints not by pursuing better coplanarity of the microbumps prior to the joining operation, but by creating plastic and elastic deformation in at least one microbumps to be joined.

Referring to FIG. 1, FIG. 1 is a cross section of a semiconductor package 10, in accordance with some embodiments of the present disclosure. The semiconductor package 10 includes a first device 101A and a second device 101B electrically bonded to the first device 101A through a first joint region JR1 and a second joint region JR2. The first device 101A includes a substrate 100A and a metallization layer 102A. Substrate 100A preferably includes a silicon substrate although other semiconductor substrates, such as silicon-germanium substrate, III-V compound substrate, or silicon on insulator (SOI) substrate may be utilized in embodiments.

In some embodiments, the substrate 100A is processed to form a device layer. As those in the art will understand, the device layer includes one or more transistors, such as MOS transistors, capacitors or other devices formed over and/or in an active region. The device layer may also include active components or circuits, such as conductive features, implantation regions, resistors, capacitors and other semiconductor elements, e.g., transistors, diodes, etc. The device layer is formed over or in the substrate 100A in a front-end-of-line (FEOL) process in some embodiments, for example. The substrate 100A may also include through-silicon vias (TSVs) 104A having a conductive material that provide connections from a back side to a front side of the substrate 100A, as shown. In the following discussion, the back side of the substrate 100A can be a called first joining surface 111A since it is the most proximal surface of the first device 101A with respect to the second device 101B.

The metallization layer 102A includes interlayer dielectric (ILD) layers and one or more metallization layers, such as M1-M9 (not shown), which can include aluminum, copper, AlCu or other conductive material. The details of the formation of devices are well known in the art of semiconductor device manufacturing and are not repeated herein. The ILD may include silicon nitride ($SiN_x$) silicon oxide ($SiO_x$) such as $SiO_2$, silicon oxynitride ($SiO_xN_y$), or silicon carbide (SiC). A metallization layer 102A is formed over the substrate 100A, e.g., over the device layer of the substrate 100A. The metallization layer 102A is formed over the substrate 100A in a back-end-of-line (BEOL) process in some embodiments, for example. The metallization layer 102A includes conductive features, such as conductive lines 105A, vias 103A, and through-dielectric vias (TDVs) 107A in the ILD. TDVs 107A may also connect together conductive lines 105A in different metallization layers (not shown). The conductive features may include conductive materials typically used in BEOL processes, such as Cu, Al, W, Ti, TiN, Ta, TaN, or multiple layers or combinations thereof. The metallization layer 102A shown is merely for illustrative purposes: the metallization layer 102A may include other configurations and may include one or more conductive line and via layers, for example.

A similar structure applies to the second device 101B. In some embodiments, the substrate 100B is processed to form a device layer. The metallization layer 102B includes inter layer dielectric (ILD) and one or more metallization layers. The metallization layer 102B includes conductive features, such as conductive lines 105B, vias 103B, and through-dielectric vias (TDVs) 107B in the ILD. TDVs 107B may also connect together conductive lines 105B in different metallization layers (not shown). The conductive pads 106B include contact pads or bond pads formed on a top surface of the metallization layer 102B, as examples. Some of the vias 103B couple conductive pads 106B to conductive lines 105B in the metallization layer 102A, and other TDVs 107B may couple contact pads 106B to the device layer of the substrate 100B (not shown). In accordance with an embodiment, the conductive pads 106B disposed proximate a top surface of the metallization layer 102B include Cu or a copper alloy, for example. In the following discussion, the top surface of the metallization layer 102B can be a called second joining surface 111B since it is the most proximal surface of the second device 101B with respect to the first device 101A.

The substrate 100A, 100B and the metallization layer 102A, 102B functionally can be, for example, a memory layer, a power device, an ASIC (application-specific integrated circuit), processor or other functional device. In some embodiments, the first device 101A can be a semiconductor chip, whereas the second device 101B can be a semiconductor wafer manufactured with IC circuits before dicing. People in the art would understand swapping the first device 101A and the second device 101B are encompassed in the contemplated scope of the present disclosure. In other embodiments, the first device 101A and the second device 101B can both be a semiconductor chip. The stacking of the first device 101A and the second device 101B can be performed utilizing wafer-to-wafer bonding, individual die-to-wafer bonding, or individual die-to-individual die bonding.

As discussed herein, vias 103A, 103B, conductive pads 106B, conductive lines 105A, 105B, TDVs 107A, 107B, and TSVs 104A, 104B can be referred to conductive components. As shown in FIG. 1, in the first joint region JR1, the TDVs 107A is protruding from the first joining surface 111A, connecting to a conductive pad 106B located over the second joining surface 111B. The conductive pad 106B can be positioned over the second joining surface 111B or at least being exposed from the second joining surface 111B. In the second joint region JR2, the TDVs 107A is protruding from the first joining surface 111A, connecting to a TDVs 107B also protruding from the second joining surface 111B. In some embodiments, an underfill 109 is disposed between the first device 101A and the second device 101B, around the first joining region JR1 and the second joining region JR2.

Figure 2:
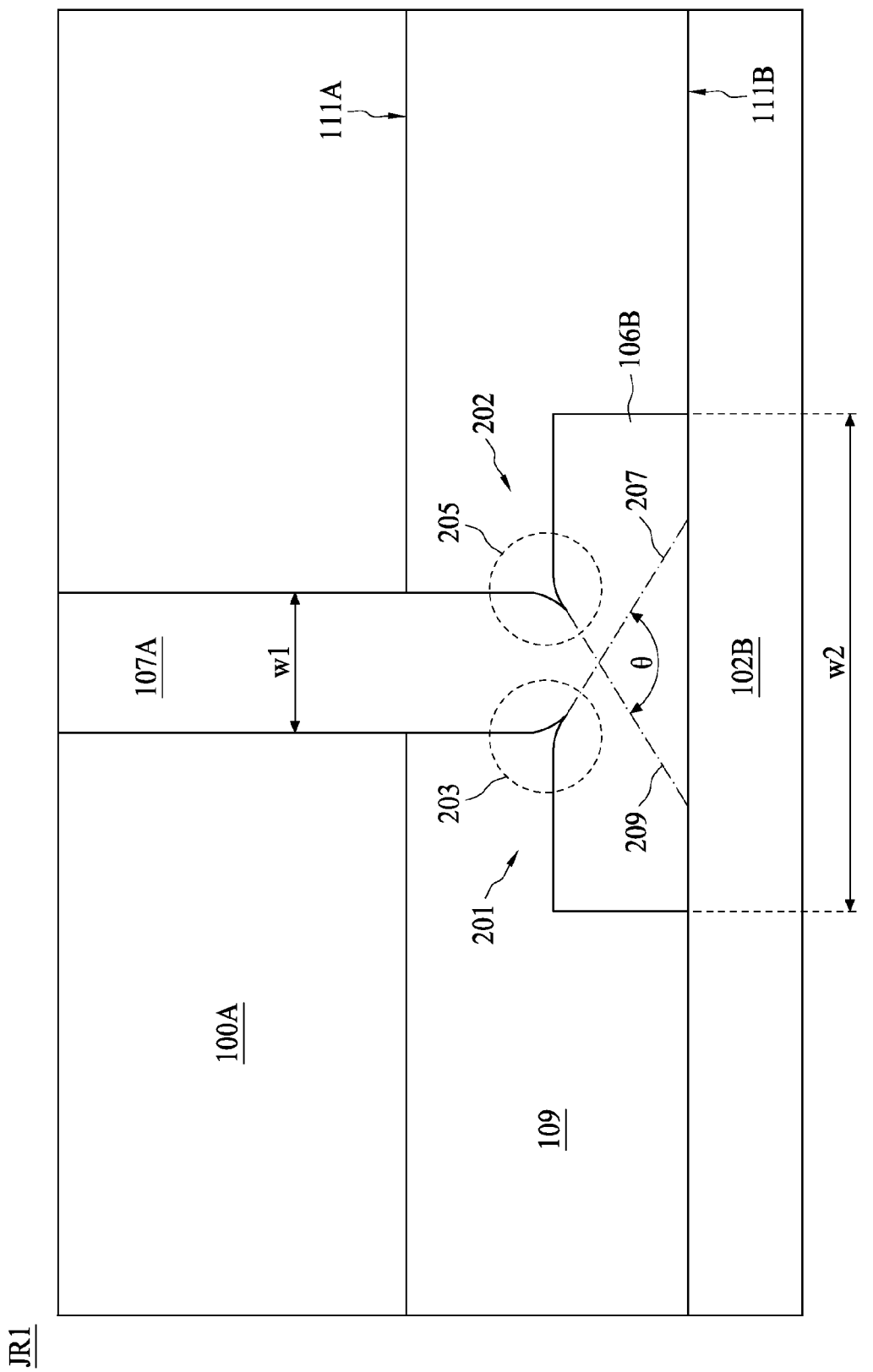
FIG. 2 is an enlarged view of a joint region of a semiconductor package, in accordance with some embodiments of the present disclosure.

Referring to FIG. 2, FIG. 2 is an enlarged view of the first joint region JR1 of a semiconductor package 10 of FIG. 1, in accordance with some embodiments of the present disclosure. The TDV 107A and the contact pad 106B form a joint surrounding by the underfill 109. A first beak 203 is formed at a first side 201 of the joint. In some embodiments, a second beak 205 is also formed at a second side 202 of the joint. Note the first beak 203 and the second beak 205 are delineated by a contour of the joint between the TDV 107A and the contact pad 106B. A tip of the first beak 203 is pointing to a direction toward the second joining surface 111B. The dash-dot-dot line 207 is a guide to an eye, demonstrating the tip direction of the beak 203. Similarly, a tip of the second beak 205 is pointing to a direction toward the second joining surface 111B. The dash-dot-dot line 209 is a guide to an eye, demonstrating the tip direction of the beak 205. The dash-dot-dot lines 207 and 209 are crossed and forming an angle θ facing the second joining surface 111B. In some embodiments, the angle θ falls in a range of from about 60 to about 170 degrees.

The beak is formed as a result of plastic and elastic deformation of the two conductive components, i.e., the TDV 107A and the contact pad 106B, when performing a joining operation. Note the TDV 107A shown in FIG. 1 and FIG. 2 includes a feature of a through dielectric via and, at the same time, a through-silicon via. For the purpose of clarity, when describing a through-dielectric via in the present disclosure, such TDV may include a feature of through-silicon via.

Figure 3:
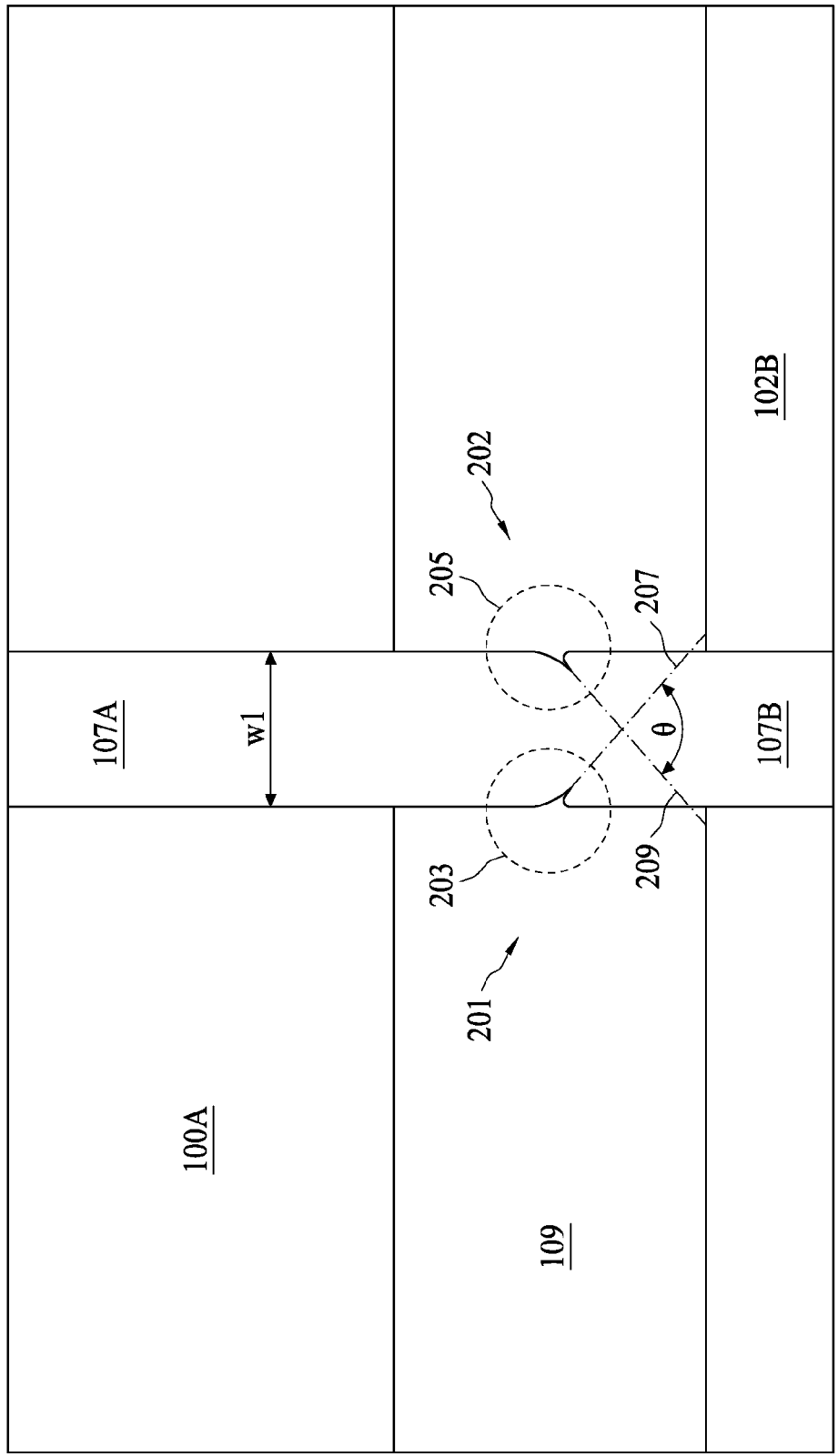
FIG. 3 is an enlarged view of a joint region of a semiconductor package, in accordance with some embodiments of the present disclosure.

As shown in FIG. 2, the first conductive component (i.e., the TDV 107A) has a width W1 that is substantially smaller than a width W2 of the second conductive component (i.e., the contact pad 106B). In other embodiments as shown in FIG. 3, the first conductive component and the second conductive component may have a substantially identical width W1. In some embodiments, the first conductive component is a microbump with a width W1, viewing from a cross section, of below 20 micrometer. Note the contact pad 106B is positioned over the second joining surface 111B as shown in FIG. 2. However, this illustration does not constitute any limitation to the present disclosure. In some embodiments, the contact pad 106B can be positioned over the first joining surface 111A and the TDV 107A be positioned over the second joining surface 111B.

Referring to FIG. 3, FIG. 3 is an enlarged view of a second joint region JR2 of a semiconductor package 10 of FIG. 1, in accordance with some embodiments of the present disclosure. Identical numeral labels shown in FIG. 3 and FIG. 2 represent identical components or equivalents thereof, and is not repeated here for simplicity. Note the first beak 203 and the second beak 205 can be observed from the first side 201 and the second side 202 of the joint. An angle θ also falls within a range of from about 60 to about 170 degrees. In FIG. 3, the first conductive component and the second conductive component are both TDVs 107A, 107B. Although the TDVs 107A, 107B depicted in FIG. 3 share an identical width W1, the present disclosure covers other scenarios where the similar conductive components may possess different scales in size. For example, the TDV 107A may have a width different from that of the TDV 107B.

Figure 4:
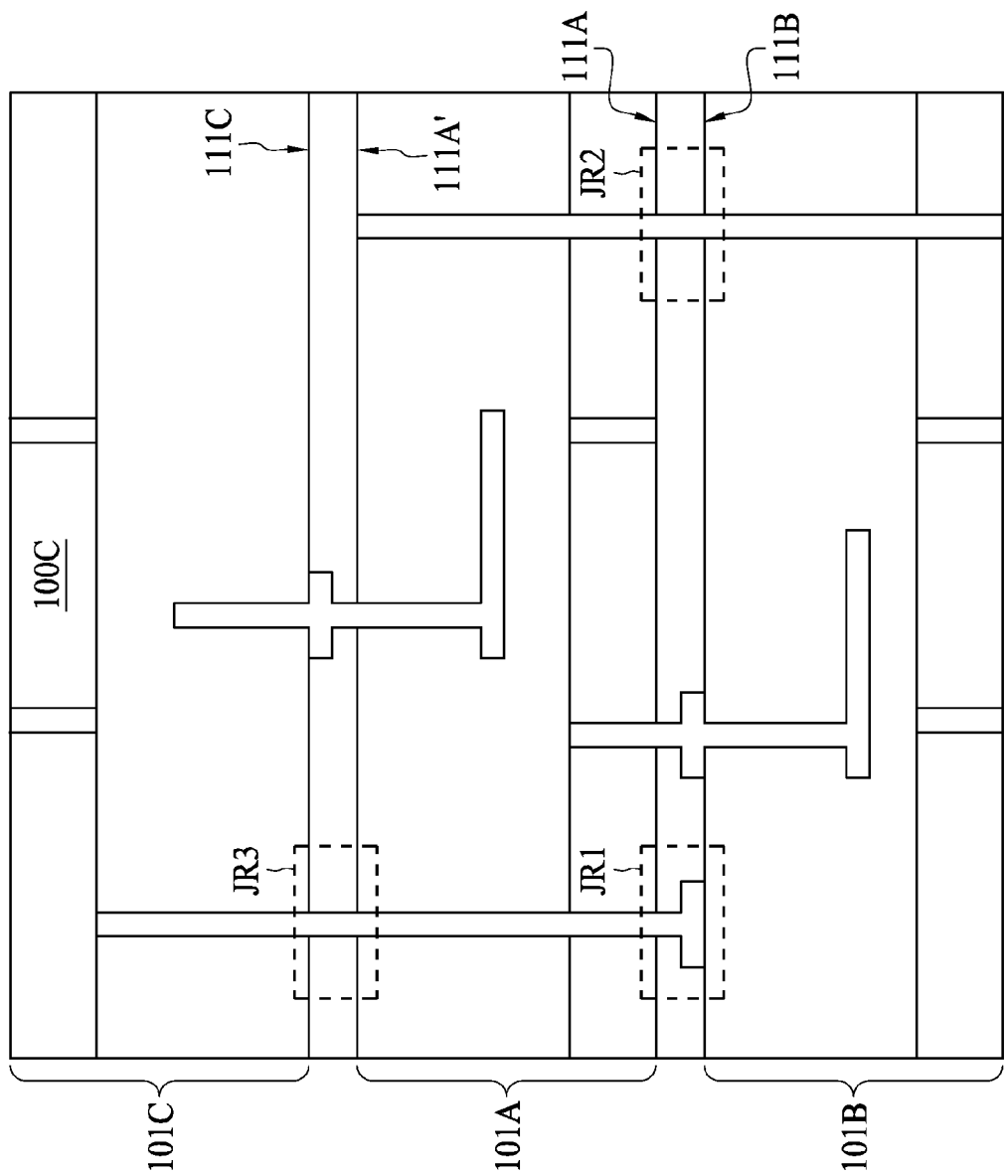
FIG. 4 is a cross section of a semiconductor package, in accordance with some embodiments of the present disclosure.

Referring to FIG. 4, FIG. 4 is a cross section of a semiconductor package 20, in accordance with some embodiments of the present disclosure. A third device 101C is structured in the manner described above for the first and second devices. It should be understood that the stack can include two, three or more devices as dictated by the design and desired functionality. Note is FIG. 4, the first device 101A and the second device 101B are stacked in a back-to-front configuration whereas the first device 101A and the third device 101C are stacked in a front-to-front configuration. Alternatively, the joining surface 111C of the third device 101C is closer to the front side of the device layer or the substrate 100C, and the joining surface 111A' of the first device 101A is closer to the front side of the device layer or the substrate 100A. The joint region JR3 formed between the first device 101A and the third device 101C is similar in structure as the second joint region JR2. Both of the joint regions JR2 and JR3 demonstrate a TDV-to-TDV bonding.

Figure 5:
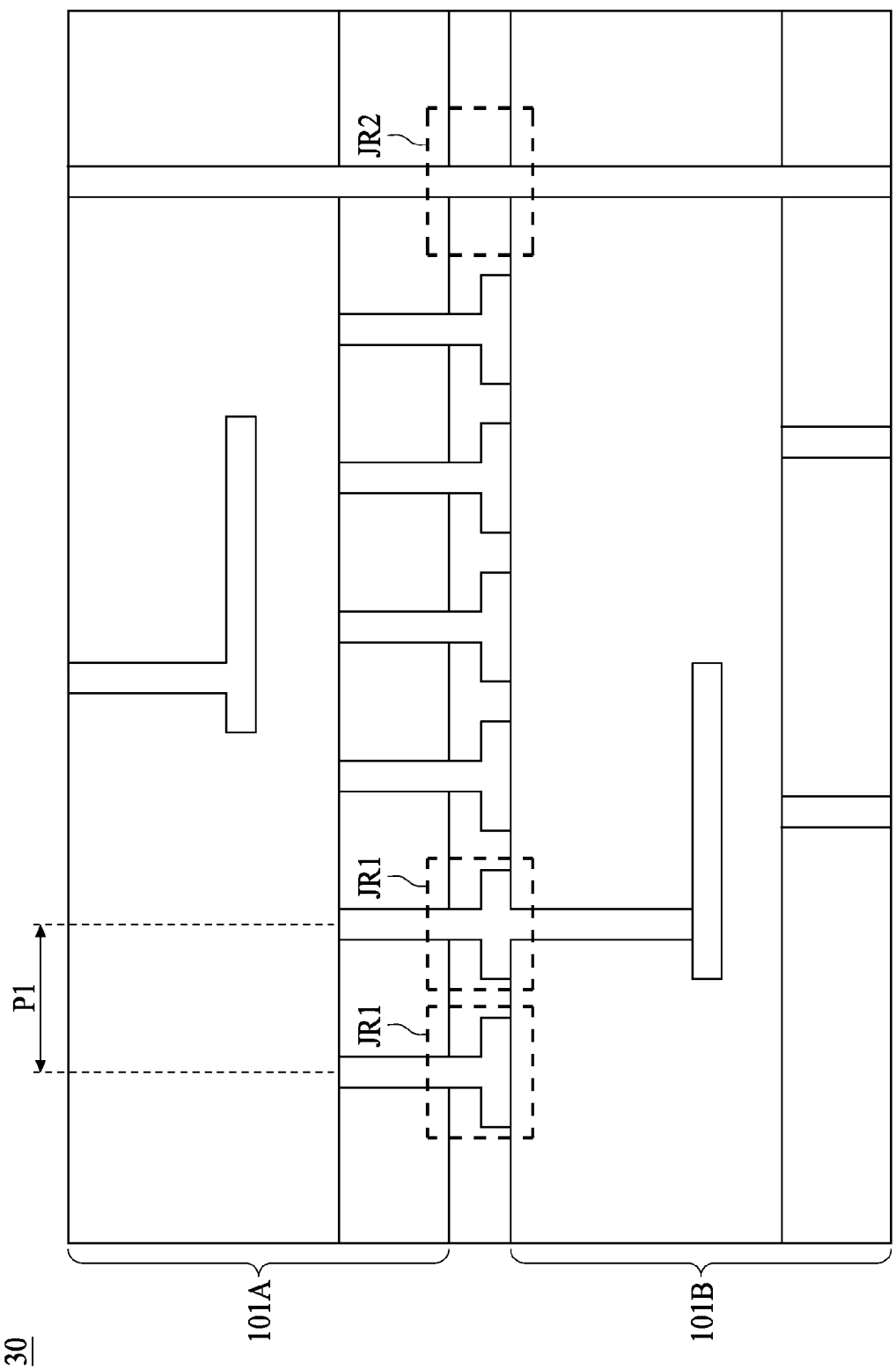
FIG. 5 is a cross section of a semiconductor package, in accordance with some embodiments of the present disclosure.

Referring to FIG. 5, FIG. 5 is a cross section of a semiconductor package 30, in accordance with some embodiments of the present disclosure. The joint region JR1 or similar structure can be arranged in an equi-spaced array with high density. In some embodiments, a pitch P1 between adjacent joint regions JR1 can be in a range of from about 10 to 80 micrometer.

Figure 6:
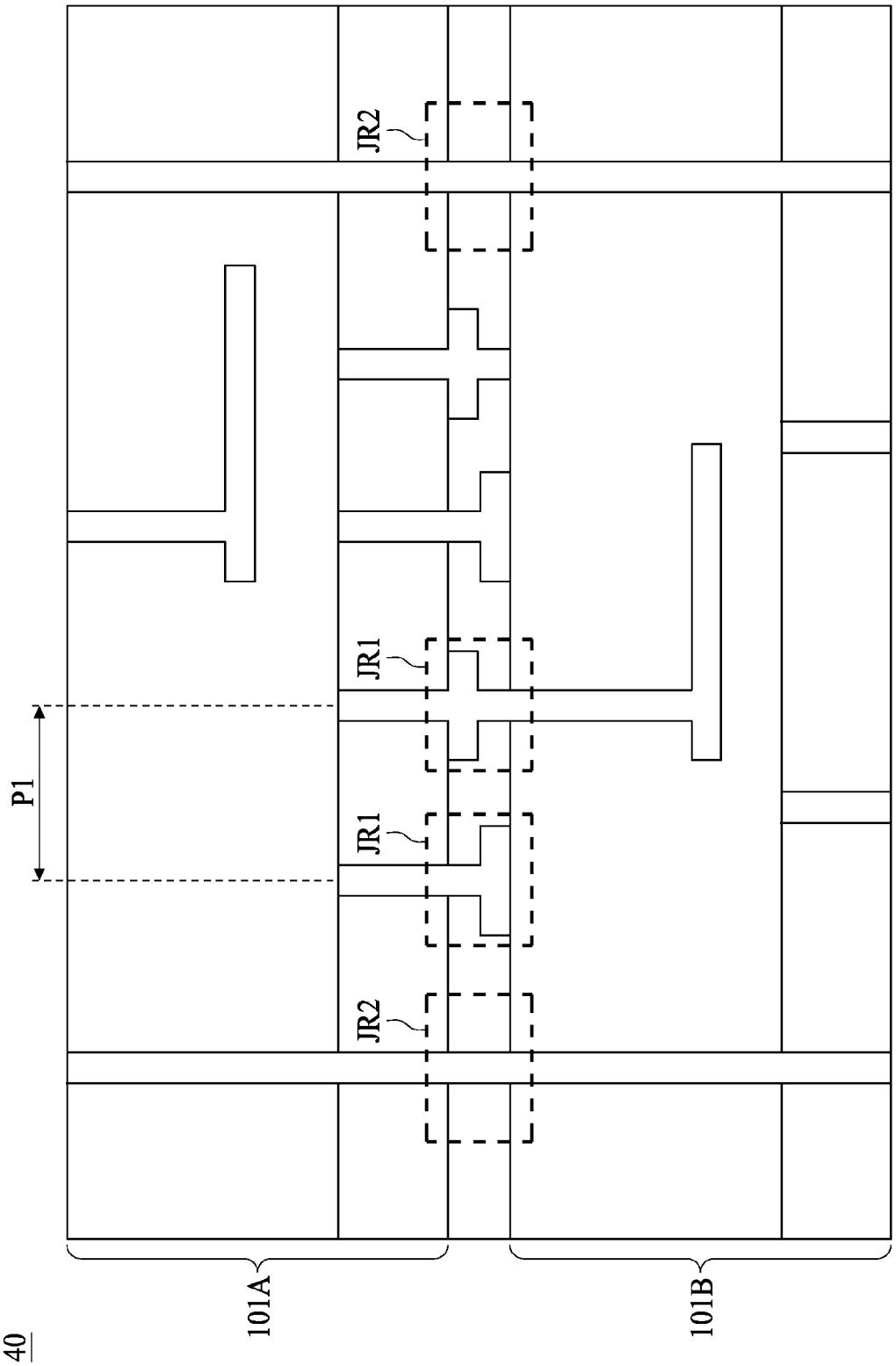
FIG. 6 is a cross section of a semiconductor package, in accordance with some embodiments of the present disclosure.

Referring to FIG. 6, FIG. 6 is a cross section of a semiconductor package 40, in accordance with some embodiments of the present disclosure. A symmetric structure between the first device 101A and the second device 101B as shown FIG. 6 could be applied to reduce the number of lithography masks utilized for forming the first joint region JR1 and the second joint region JR2.

Figure 7:
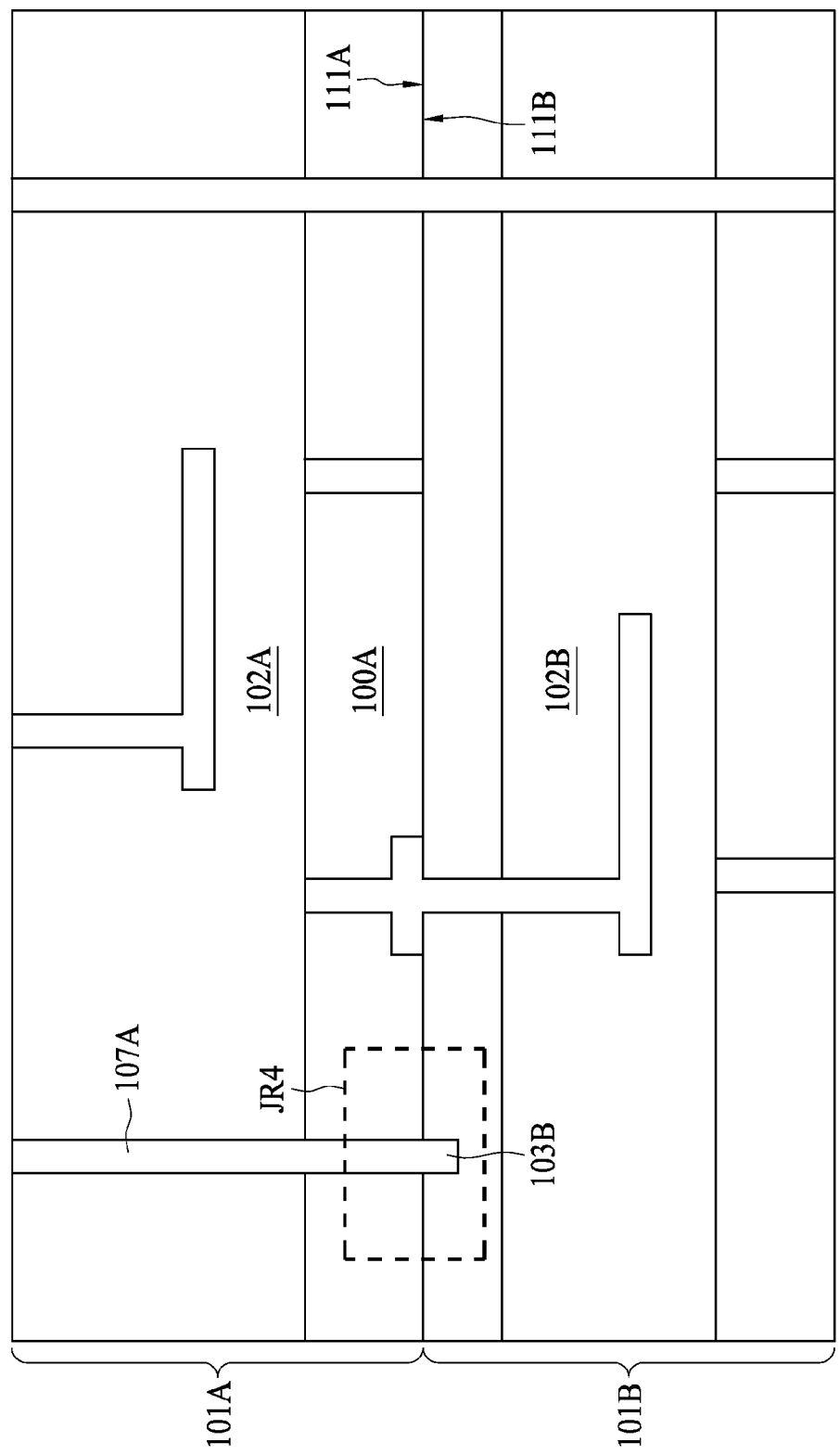
FIG. 7 is an enlarged view of a joint region of a semiconductor package, in accordance with some embodiments of the present disclosure.

Referring to FIG. 7, FIG. 7 is a cross section of a semiconductor package 50, in accordance with some embodiments of the present disclosure. In FIG. 4, the first joining surface 111A and the second joining surface 111B are hybrid-bonded. The hybrid bond includes at least one metal-to-metal bond (Cu—Cu) and a non-metal-to-non-metal bond at the interface between the stacked devices 101A, 101B. In some embodiments, the non-metal-to-non-metal bond can comprise combinations dielectric bonds between Si, $SiN_x$, $SiO_x$, or a polymer. In one embodiment, the non-metal-to-non-metal bond is $SiO_2$ to $SiO_2$. As shown in FIG. 7, a native oxide layer (not shown) over the first joining surface 111A of the first substrate 100A can be bonded to the top surface of the ILD (i.e., the second joining surface 111B). Alternatively, the non-metal-to-non-metal bond includes an adhesive bond using an adhesive layer such as BCB or polyimide applied to one or more of the devices. A portion of the hybrid bonding operation may include a fusion process that forms the non-metal-to-non-metal bonds, and a portion of the hybrid bonding process may include a metal-to-metal (e.g., copper-to-copper) bonding process that formed the metal-to-metal bonds, for example. The term "hybrid" refers to the formation of the two different types of bonds using a single bonding operation, rather than forming only one type of bond as is the practice in other types of wafer-to-wafer bonding processes, for example.

Figure 8:
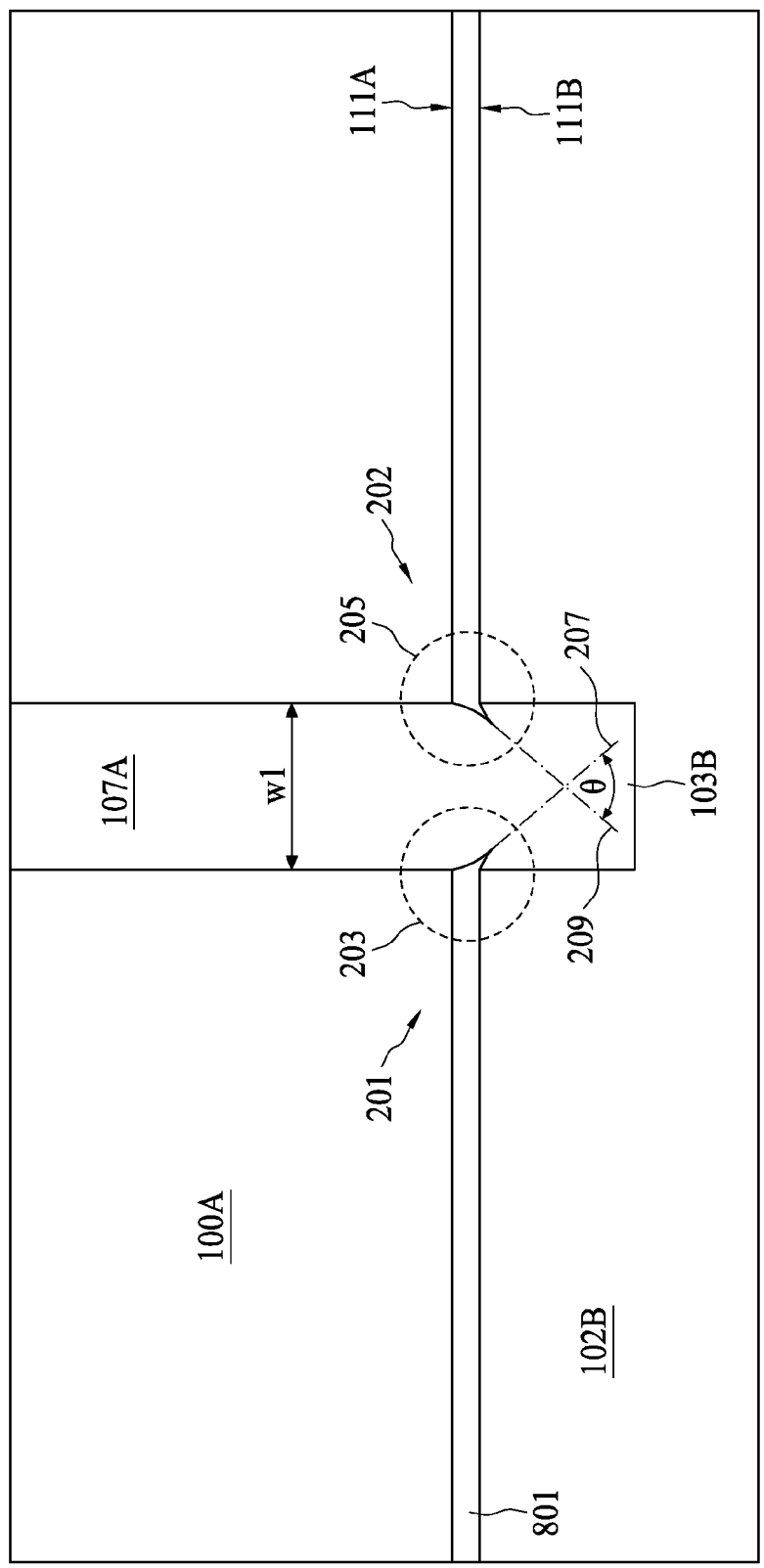
FIG. 8 shows a deformation process of a joint region of a semiconductor package with respect to time, in accordance with some embodiments of the present disclosure.

Referring to FIG. 8, FIG. 8 is an enlarged view of a joint region JR4 of a semiconductor package 40 of FIG. 6, in accordance with some embodiments of the A present disclosure. The joint region JR4 in FIG. 8 is formed by a first conductive component (i.e., TDV 107A) and a second conductive component (i.e., conductive via 103B). A native oxide layer 701 over the first joining surface 111A is further demonstrated in FIG. 8. In a hybrid bonding scheme, the first joining surface 111A is in proximity to the second joining surface 111B, and the first conductive component is connected with the second conductive component by deforming a portion of the second conductive component such that the native oxide 801 over the first joining surface 111A can be in contact with the second joining surface 111B to complete the fusion process of the hybrid bonding. Note the first beak 203 and the second beak 205 can be observed from the first side 201 and the second side 202 of the joint. An angle θ also falls within a range of from about 60 to about 170 degrees. Further description of the deformation process will be discussed in FIG. 9 and FIG. 10 of the present disclosure.

Figure 9:
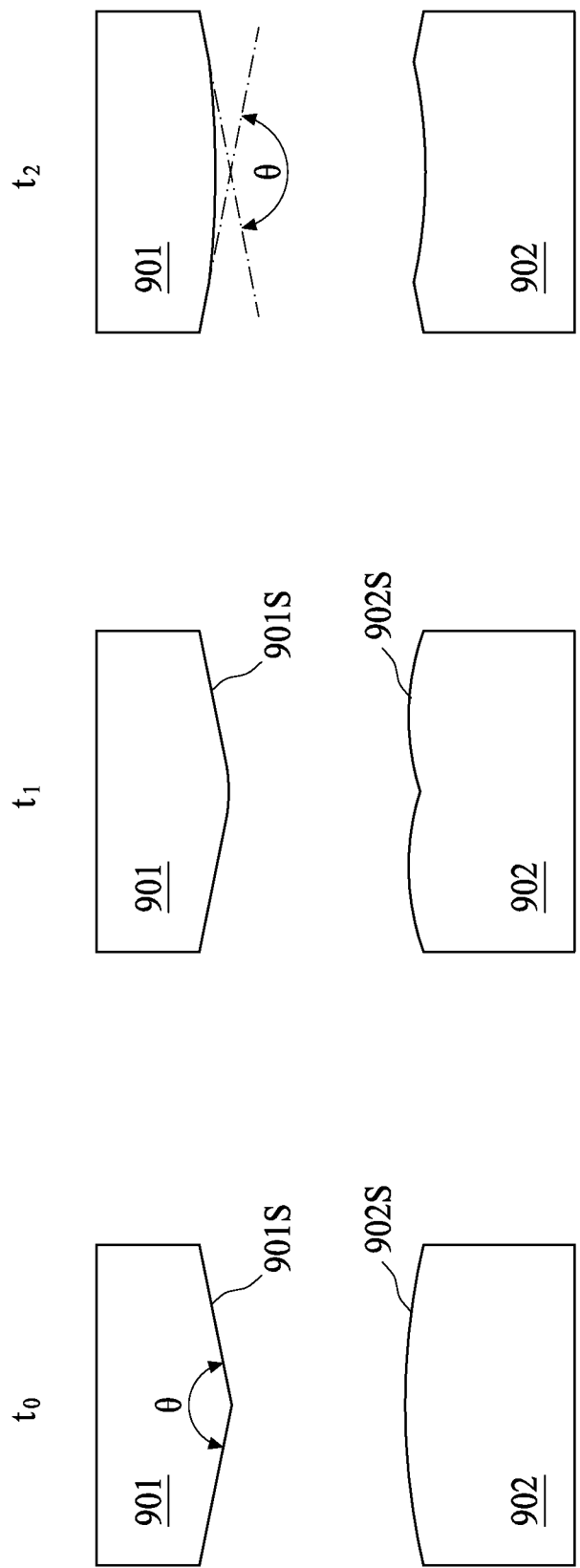
FIG. 9 shows a deformation process of a joint region of a semiconductor package with respect to time, in accordance with some embodiments of the present disclosure.
Figure 10:
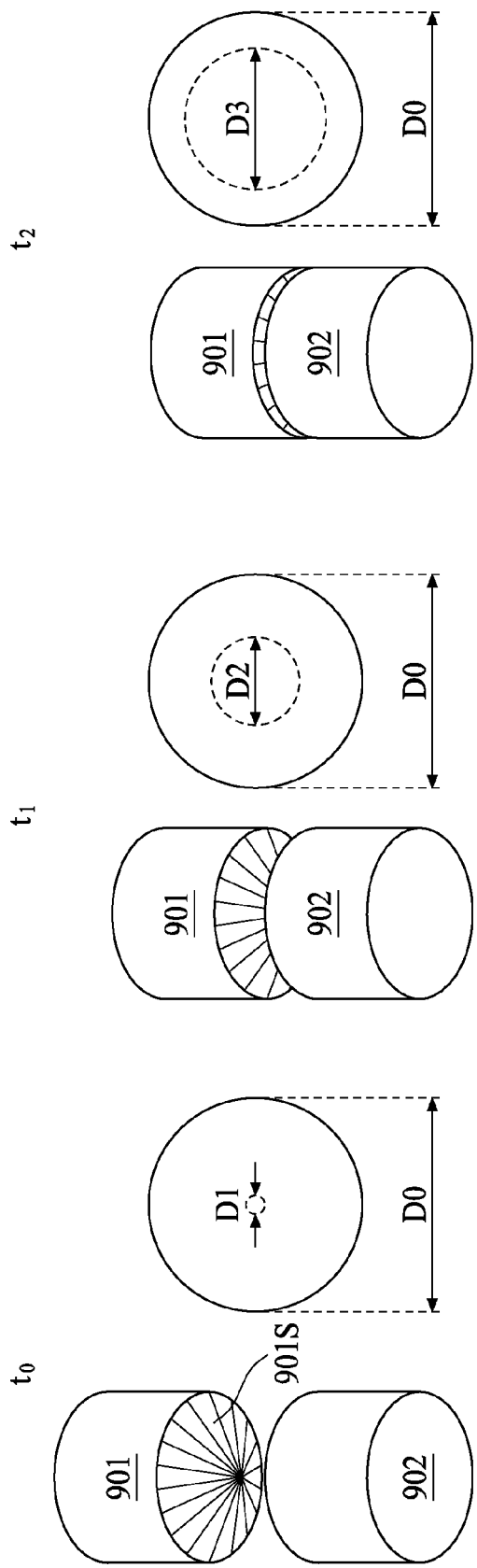
FIG. 10 to FIG. 16 show fragmentary cross section of operations for manufacturing a semiconductor package, in accordance with some embodiments of the present disclosure.

Referring to FIG. 9 and FIG. 10, both of the figures show a deformation process of a joint region of a semiconductor package with respect to time, in accordance with some embodiments of the present disclosure. At a given time $t_0$, a first conductive component 901 is totally separated from the second conductive component 902. The first conductive component 901 may include an uneven surface 901S having, for example, at least one tip. In some embodiments, the at least one tip constitutes an angle θ in a range of from about 60 to about 170 degrees. A surface 902S of the second conductive component at $t_0$ is deformation-free. For simplicity, a diameter of the first conductive component 901 and the second conductive component 902 are depicted identical as D0. D1, D2, D3 of FIG. 10 is a diameter of a contact region, presumably circular, between the first conductive component 901 and the second conductive component 902 at various time points $t_0$, $t_1$, $t_2$, respectively. D1 of time $t_0$ is substantially zero. In time $t_1$, the tip of the first conductive component 901 is in contact with the second conductive component 902 with a predetermined pressure. D2 of time $t_1$ is formed to be a finite number below the diameter D0. In FIG. 9, the surfaces 901S and 902S are both deformed elastically. A dimple can be observed on the surface 902S and a rounded tip can be observed on the surface 901S. At a given time $t_2$, the tip of the first conductive component 901 is further pressing toward the second conductive component 902 with a predetermined pressure. D3 of time $t_2$ is formed to be a finite number below the diameter D0 but greater than that of D2. In FIG. 9, the surfaces 901S and 902S are both deformed elastically and plastically. Plastic deformation is largely occurred in a center portion of the first and the second conductive components 901, 902. The angle θ can be identified at the beak by extending the tip of the beak as previously discussed.

Figure 11:
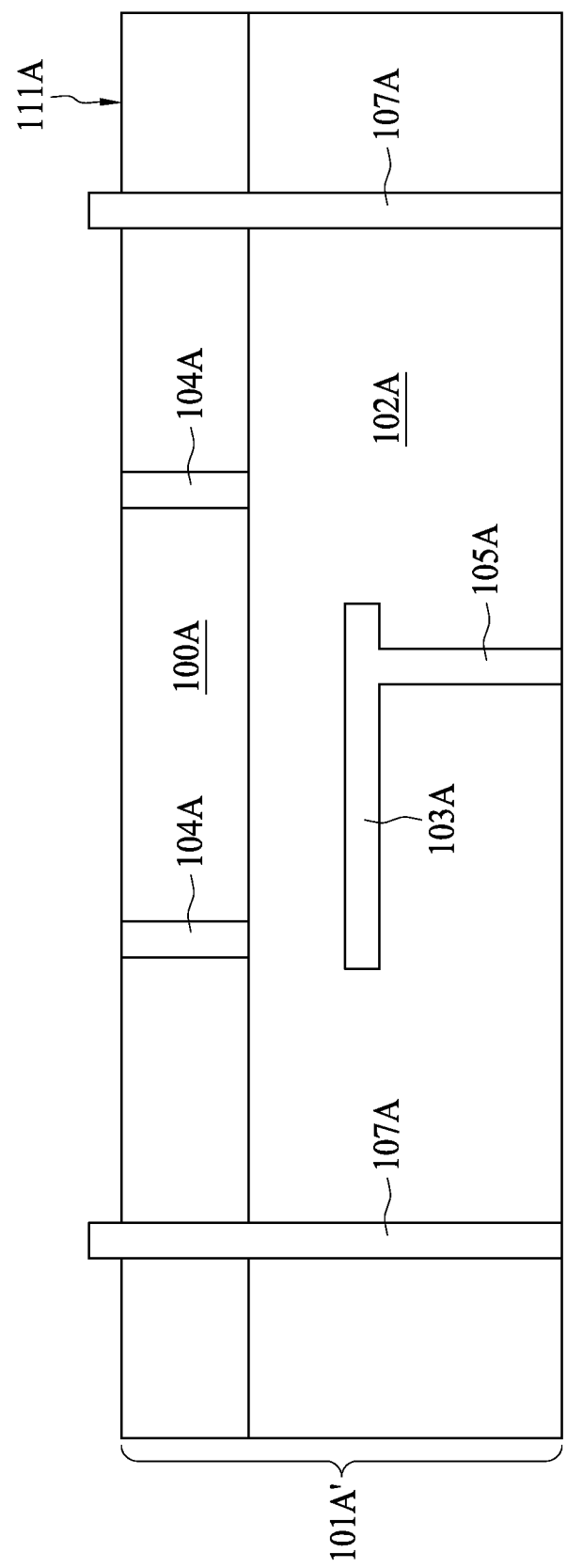

FIG. 11 to FIG. 16 show fragmentary cross section of operations for manufacturing a semiconductor package, in accordance with some embodiments of the present disclosure. In FIG. 11, a first device 101A' is provided. Identical numeral labels appeared in FIG. 11 and FIG. 1 refer to identical components or equivalents thereof and are not repeated here for simplicity. As shown in FIG. 11, the first device 101A' includes a first surface to be joined (refers to the first joining surface 111A previously discussed) and first conductive components such as the TDVs 107A partially protruding from the first joining surface 111A. In some embodiments, some of the conductive components can be made of Copper Damascene process. For example, the TDVs 107A are formed using a Damascene process, wherein the ILD 102A is deposited over the substrate 100A and trenches are patterned using lithography. The patterned trenches are filled with a conductive material by an electroplating operation, and excess portions of the conductive material are removed from over the first joining surface 111A using a chemical mechanical polishing (CMP) process, an etch process, or combinations thereof. Details of electroplating the TDVs in the trenches are provided below.

TDVs 107A may be formed from W, and more preferably from copper (Cu), including AlCu (collectively, Cu). In one embodiment, TDVs 107A are formed using the Damascene process, which should be familiar to those in the art. First, trenches are etched through the ILD 102A and into substrate 100A. This process can be performed by plasma etch process, such as an Inductively Coupled Plasma (ICP) etch. A dielectric liner (not shown) then may be deposited on the trenches sidewalls. In embodiments, the liner materials may include silicon oxide ($SiO_x$) or silicon nitride ($SiN_x$), which may be formed by plasma deposition process, such as physical vapor deposition (PVD) or chemical vapor deposition (CVD) including plasma enhanced chemical vapor deposition (PECVD). Next, a seed layer of Cu is deposited in the trenches. Then a layer of copper is plated in the trenches, followed by planarization of the copper layer, such as by chemical mechanical polishing (CMP), down to the top surface of a dielectric layer (not shown) or photoresist over the first joining surface 111A. The exposed copper surface and dielectric layer can be coplanar or the Cu surface may protrude above the top surface of the first joining surface 111A.

Figure 12:
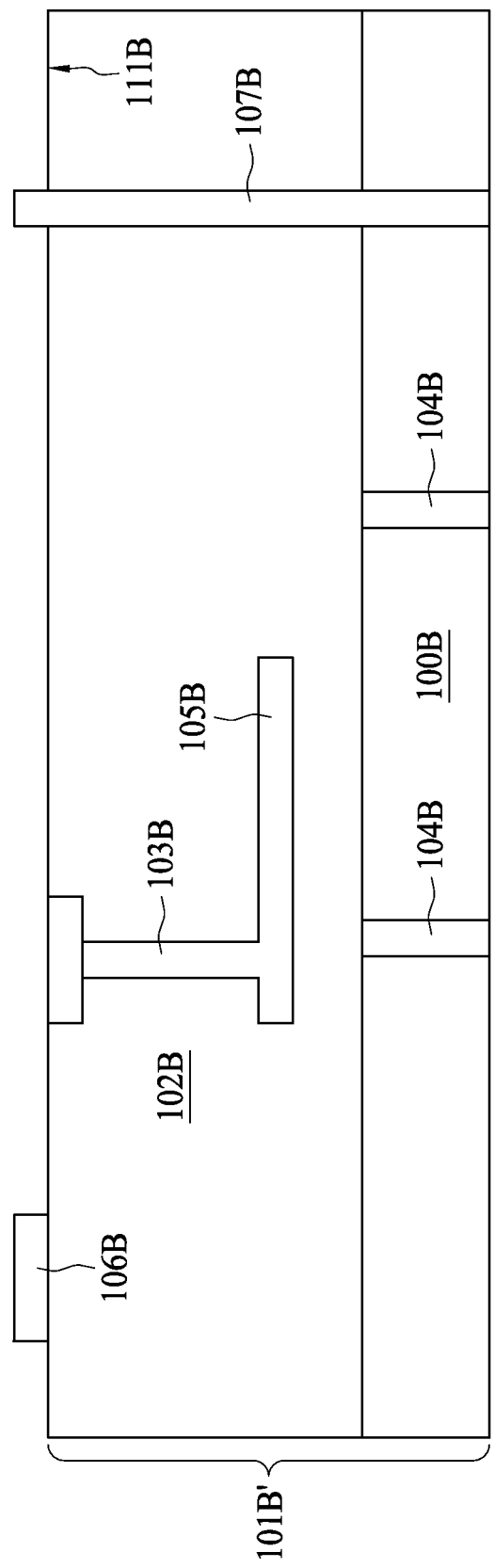

In FIG. 12, a second device 101B' is provided. Identical numeral labels appeared in FIG. 11 and FIG. 1 refer to identical components or equivalents thereof and are not repeated here for simplicity. As shown in FIG. 12, the second device 101B' includes a second surface to be joined (refers to the second joining surface 111B previously discussed) and second conductive components such as the TDVs 107B and contact pads 106B at least partially protruding from the second joining surface 111B. In some embodiments, some of the conductive components can be made of Copper Damascene process.

Figure 13:
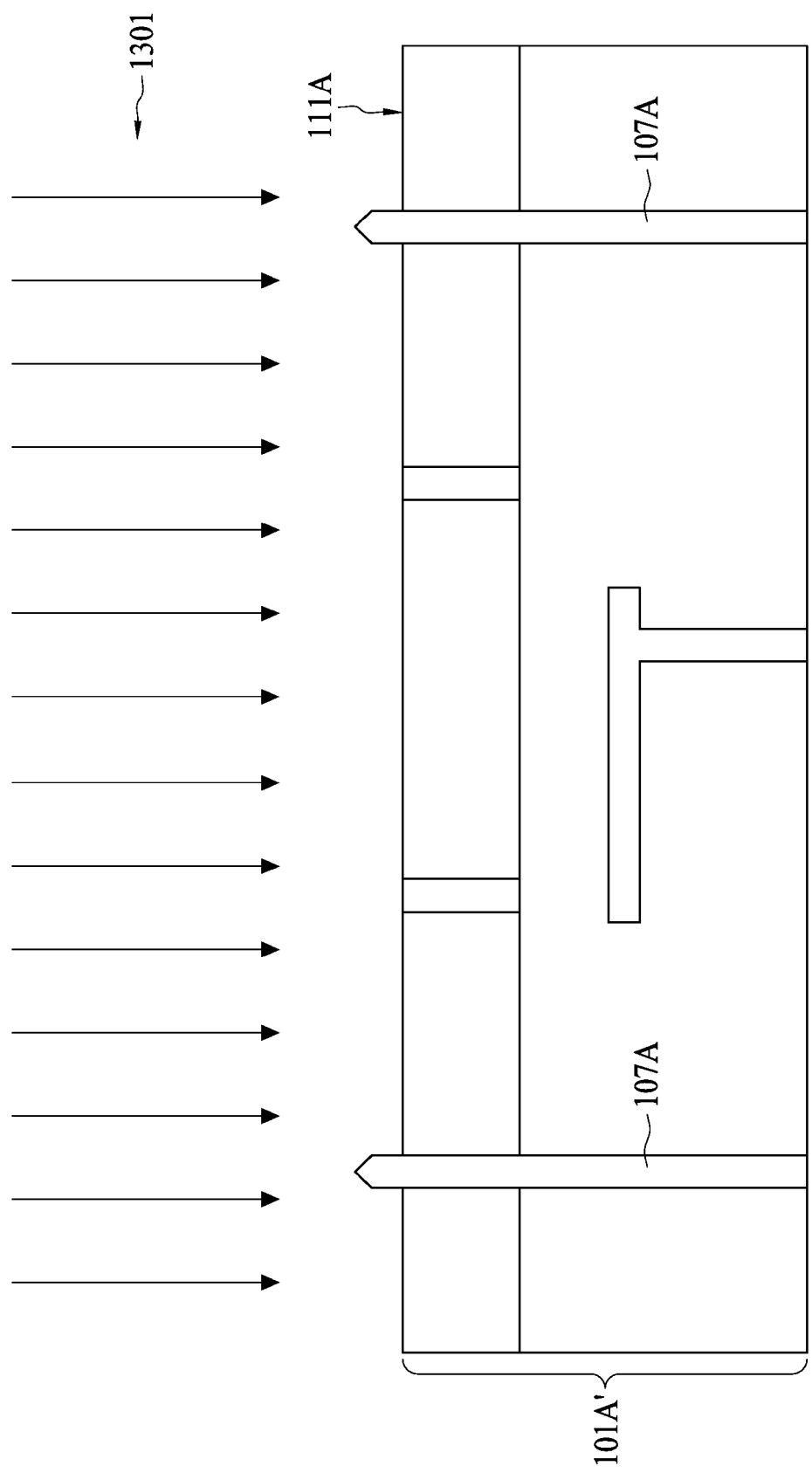

Referring to FIG. 13, an etching operation 1301 is conducted over the first joining surface 111A and the TDVs 107A protruding therefrom. In some embodiments, the etching operation includes copper wet etch, copper dry etch, or the combinations thereof. The copper wet etch, for example, can be conducted by employing 1% of $H_2SO_4$ over the top surface of the TDVs 107A for about 10 to 180 seconds and obtain an uneven surface including at least one tip, as shown in FIG. 13 and those further demonstrated in FIG. 17A to FIG. 17D. The copper dry etch, for example, can be conducted by employing Chlorine-containing gas over the top surface of the TDVs 107A and obtain an uneven surface including at least one tip, as shown in FIG. 12 and further demonstrated in FIG. 17A to FIG. 17D. The profile over the top surface of the first conductive component (i.e., the TDVs 107A) is characterizable for having at least one tip. In some embodiments, the tip formed by the aforesaid operations possesses an angle of from about 60 to about 170 degrees.

Figure 14:
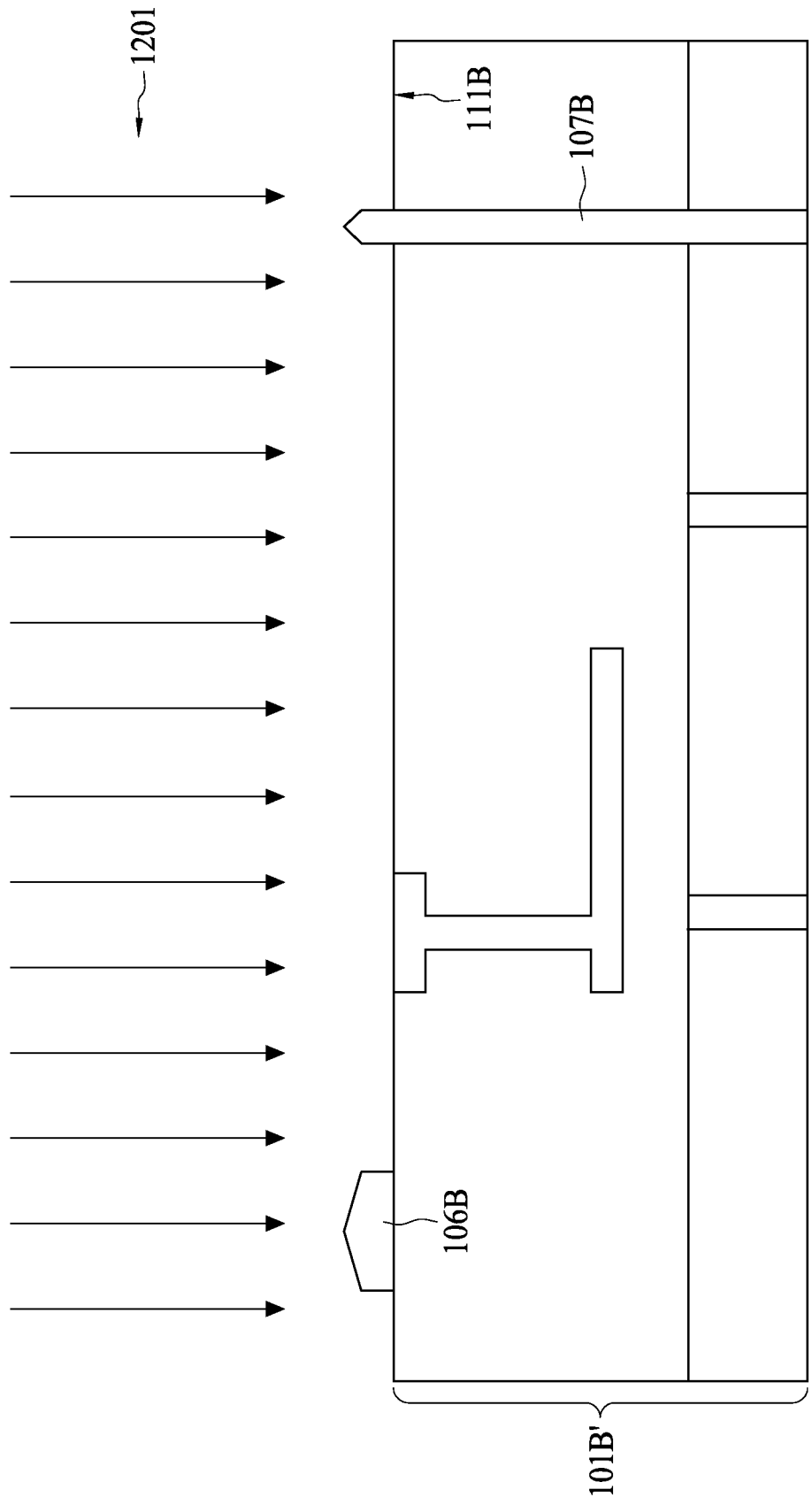

In FIG. 14, the same etching operation described in FIG. 13 can be optionally applied to the second device 101B'. The conductive pad 106B and the TDV 107B are etched to obtain an uneven surface including at least one tip, as shown in FIG. 14 and those further demonstrated in FIG. 17A to FIG. 17D. Since only one of the first device 101A' and the second device 101B' being etched serves the purpose of the present disclosure, one of the etching operations depicted in FIG. 13 and FIG. 14 can be optional. Employing the aforesaid etching operation on both devices to be joined is also encompassed in the contemplated scope of the present disclosure.

Figure 15:
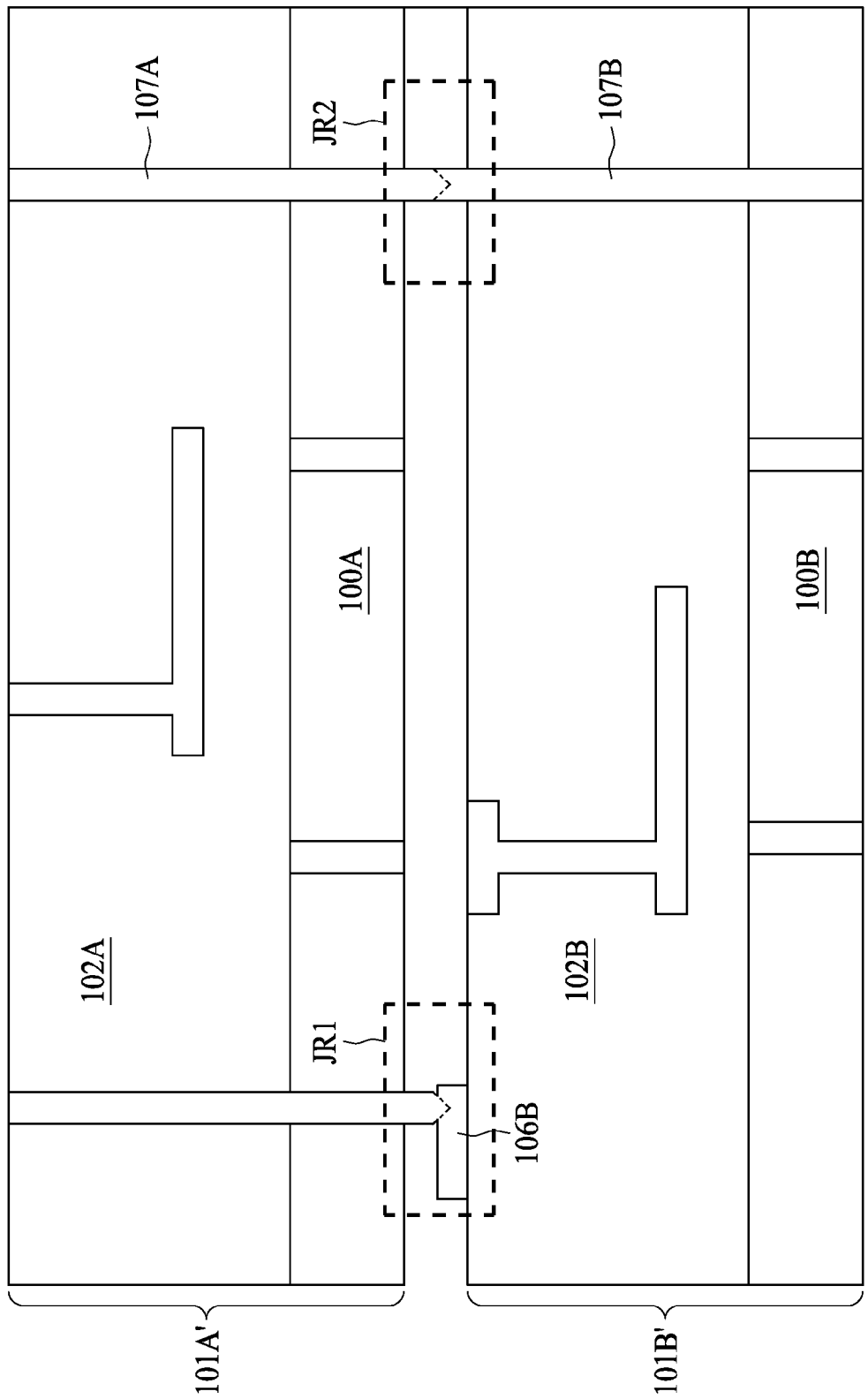

Referring to FIG. 15, the first and second devices, with each device including a substrate or device layer with metallization layer(s) formed thereover, are aligned and bonded together. Specifically, FIG. 15 shows the devices aligned in a back-to-face alignment, where the backside (thinned substrate 100A) of the first device faces the top surface (ILD 102B side) of the second device. The TDVs 107A, 107B and contact pad 106B are aligned and contacted. The stacked structure is then annealed for a time and temperature sufficient to bond TDVs 107A, 107B, and contact pad 106B. By way of example, assuming TDVs 107A, 107B and contact pad 106B are formed of copper, substrate 100A is a silicon substrate and ILD 102B is silicon oxide, the stack shown in FIG. 15 is undergoing an annealing operation at a temperature range between 150 to 300 degrees Celsius under suitable pressure, for example, from 20 MPa to 300 MPa. The temperature applied in the present joining operation is lower than that used in conventional metal-to-metal bonding because conventionally, two metal surfaces are microscopically too planar to be joined without any capacity for elastic or plastic deformation with respect to realistic practice. The lower temperature adopted in the wafer-to-wafer/wafer-to-die bonding operation benefits the structural integrity of the low-k dielectric previously deposited in the devices, especially for some memory devices.

Figure 16:
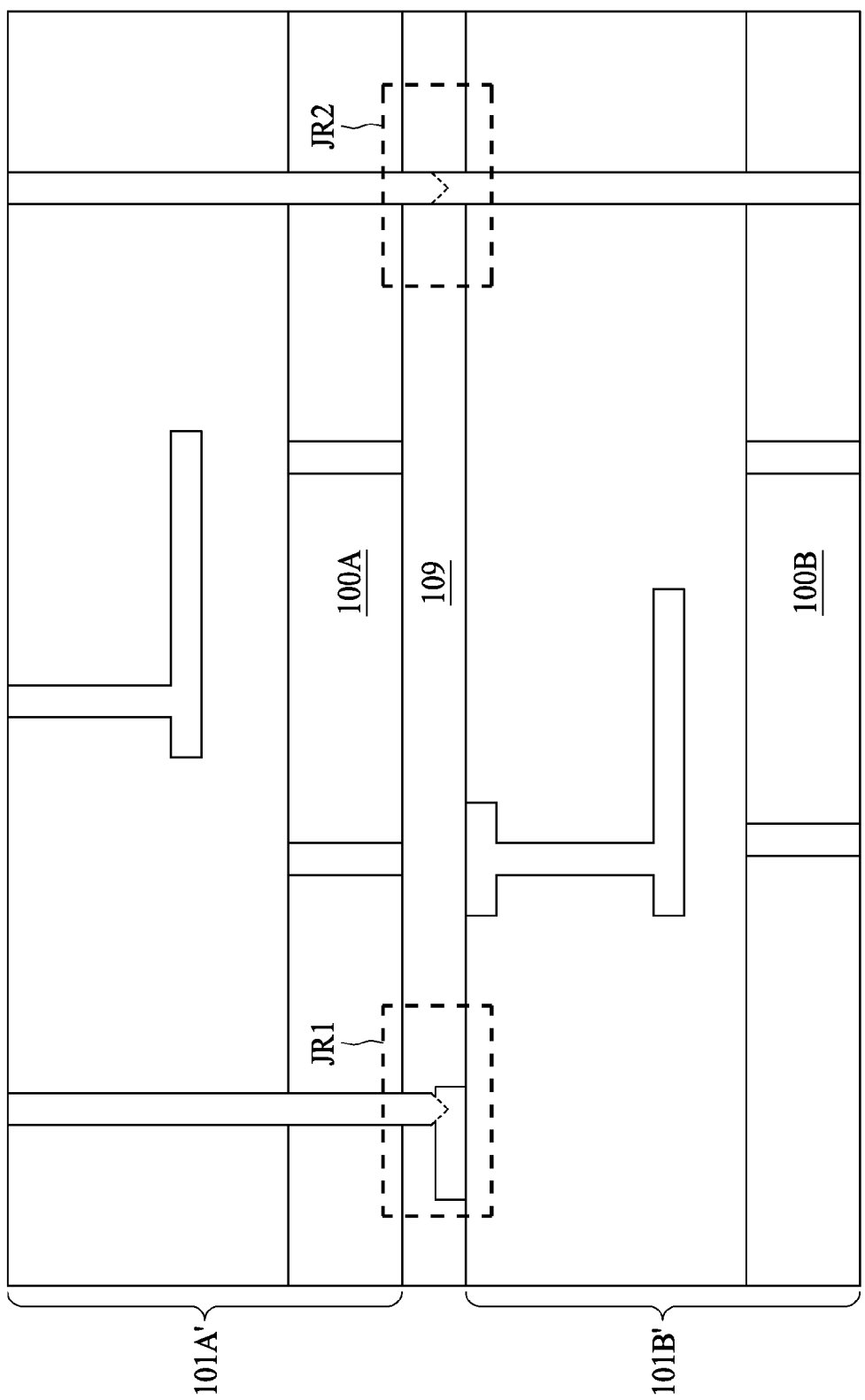

Referring to FIG. 16, an underfill 109 can be applied during the bonding operation as shown in FIG. 15. In some embodiments, the underfill 109 is photo-sensitive and could spin-on over either of the first or the second device before bonding operation. Dotted lines at the joint regions JR1, JR2 shown in FIG. 15 and FIG. 16 are schematic illustration of the plastic and/or elastic deformation of one of the conductive component in, for example, the first device 101A' that penetrates into the conductive component of the second device 101B'. In some embodiments, the conductive components of the first device 101A' and the second device 101B' can both possess the at least one tip feature as previously discussed for the joining operation depicted in FIG. 15 and FIG. 16. An enlarged view of the joint regions JR1, JR2 shown in FIG. 15 includes the beak previously described and can be referred to FIG. 2 and FIG. 3 of the present disclosure.

Figure 17A:
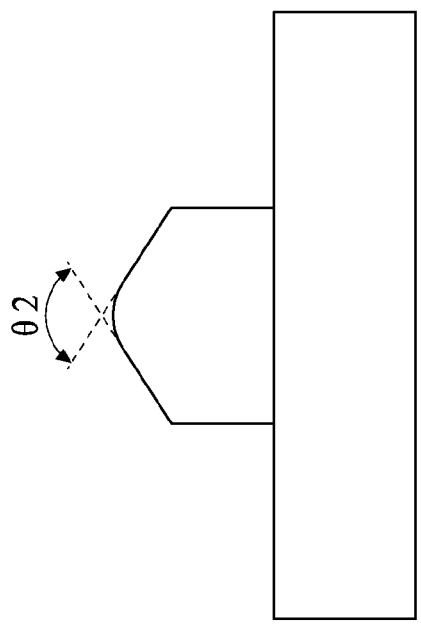
FIG. 17A to FIG. 17D are cross sections of conductive components after an etching operation, in accordance with some embodiments of the present disclosure.
Figure 17B:
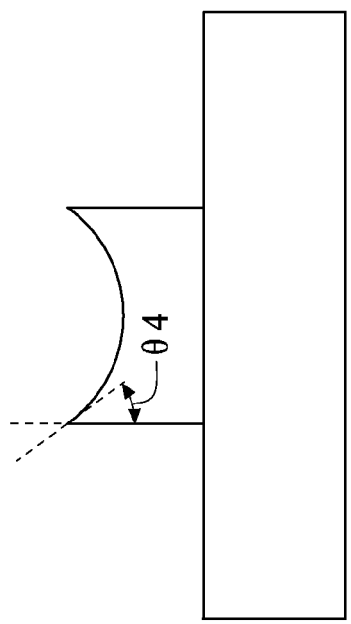
Figure 17C:
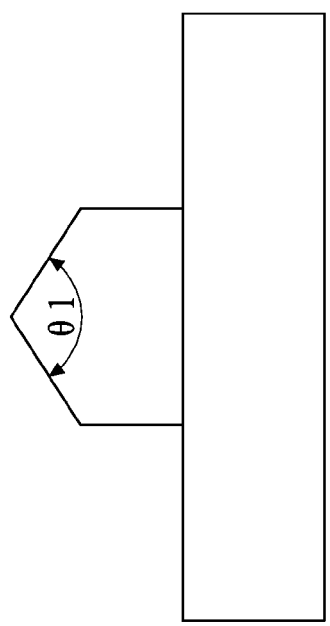
Figure 17D:
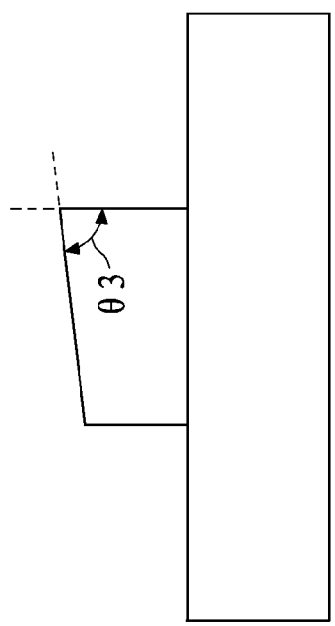

FIG. 17A to FIG. 17D are cross sections of conductive components after an etching operation, in accordance with some embodiments of the present disclosure. After the etching operation discussed in FIG. 13 and FIG. 14, the uneven surfaces of the first conductive component or the second conductive component may possess various features. In FIG. 17A, a tip is formed nearly at a center of the conductive component with a characterizable angle $\theta1$. In FIG. 17B, a rounded tip is formed nearly at a center of the conductive component with a characterizable angle $\theta2$. The characterizable angle $\theta2$ is measured between two extension lines along two slanted surfaces in proximity to the edge of the conductive component. In FIG. 17C, a tip is formed nearly at one side of the conductive component with a characterizable angle $\theta3$. Note the embodiment shown in FIG. 17C covers the scheme where the tip falls between the center and the edge of the conductive component. In FIG. 17D, two tips are formed at the edge of the conductive component with a characterizable angle $\theta4$.

Figure 18:
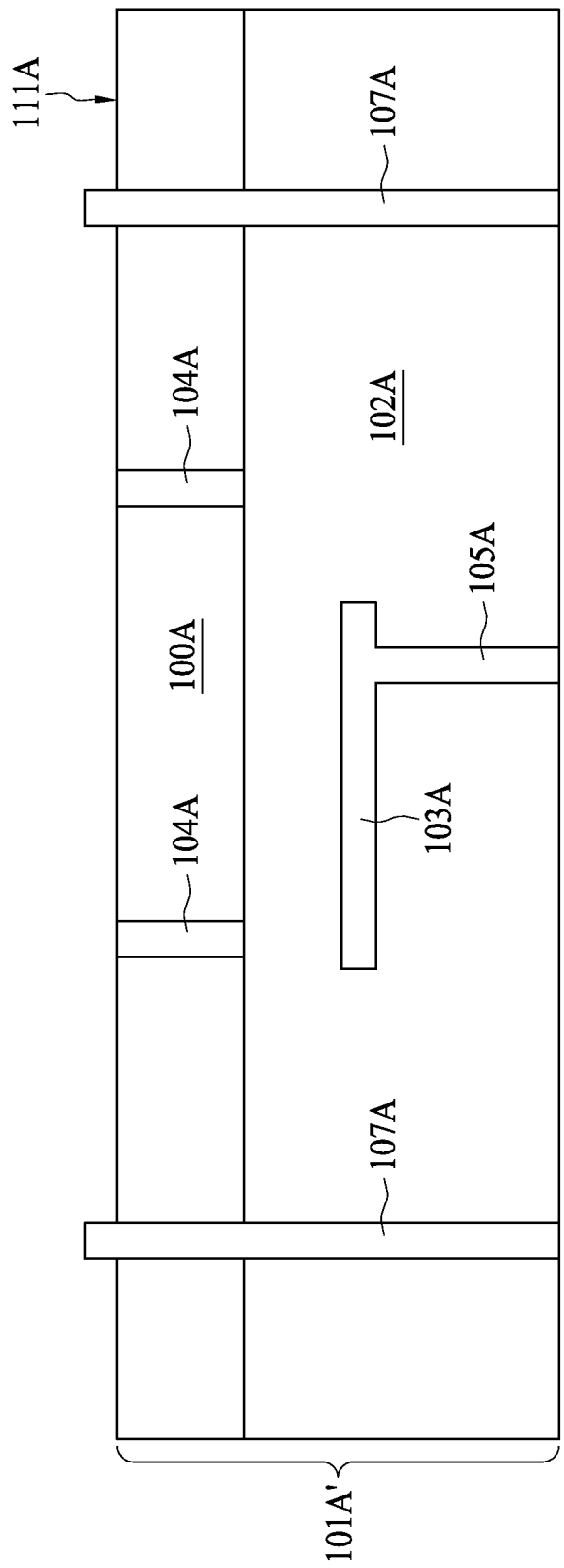
FIG. 18 to FIG. 22 show fragmentary cross section of operations for manufacturing a semiconductor package, in accordance with some embodiments of the present disclosure.
Figure 19:
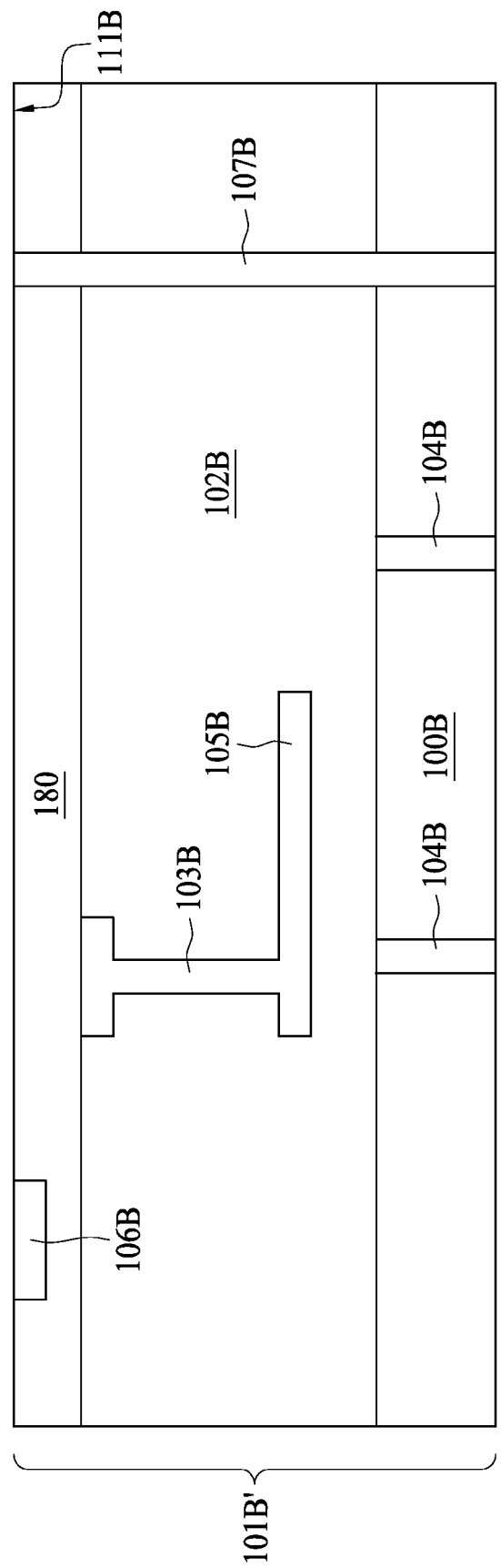

FIG. 18 to FIG. 22 show fragmentary cross section of operations for manufacturing a semiconductor package, in accordance with some embodiments of the present disclosure. In FIG. 18 a first device 101A' is provided. Identical numeral labels appeared in FIG. 18 and FIG. 1 refer to identical components or equivalents thereof and are not repeated here for simplicity. As shown in FIG. 18 the first device 101A' includes a first surface to be joined (refers to the first joining surface 111A previously discussed) and first conductive components such as the TDVs 107A partially protruding from the first joining surface 111A. In FIG. 19 a second device 101B' is provided. Identical numeral labels appeared in FIG. 19 and FIG. 1 refer to identical components or equivalents thereof and are not repeated here for simplicity. As shown in FIG. 19, the second device 101B' includes a second surface to be joined (refers to the second joining surface 111B previously discussed) and second conductive components such as the TDVs 107B and contact pads 106B exposing from the second joining surface 111B. Note the contact pad 106B and the TDVs 107B are coplanar with a dielectric layer 180 and top surfaces of the contact pad 106B and the TDVs 107B are exposed from the dielectric layer 180 for subsequent hybrid bonding.

Figure 20:
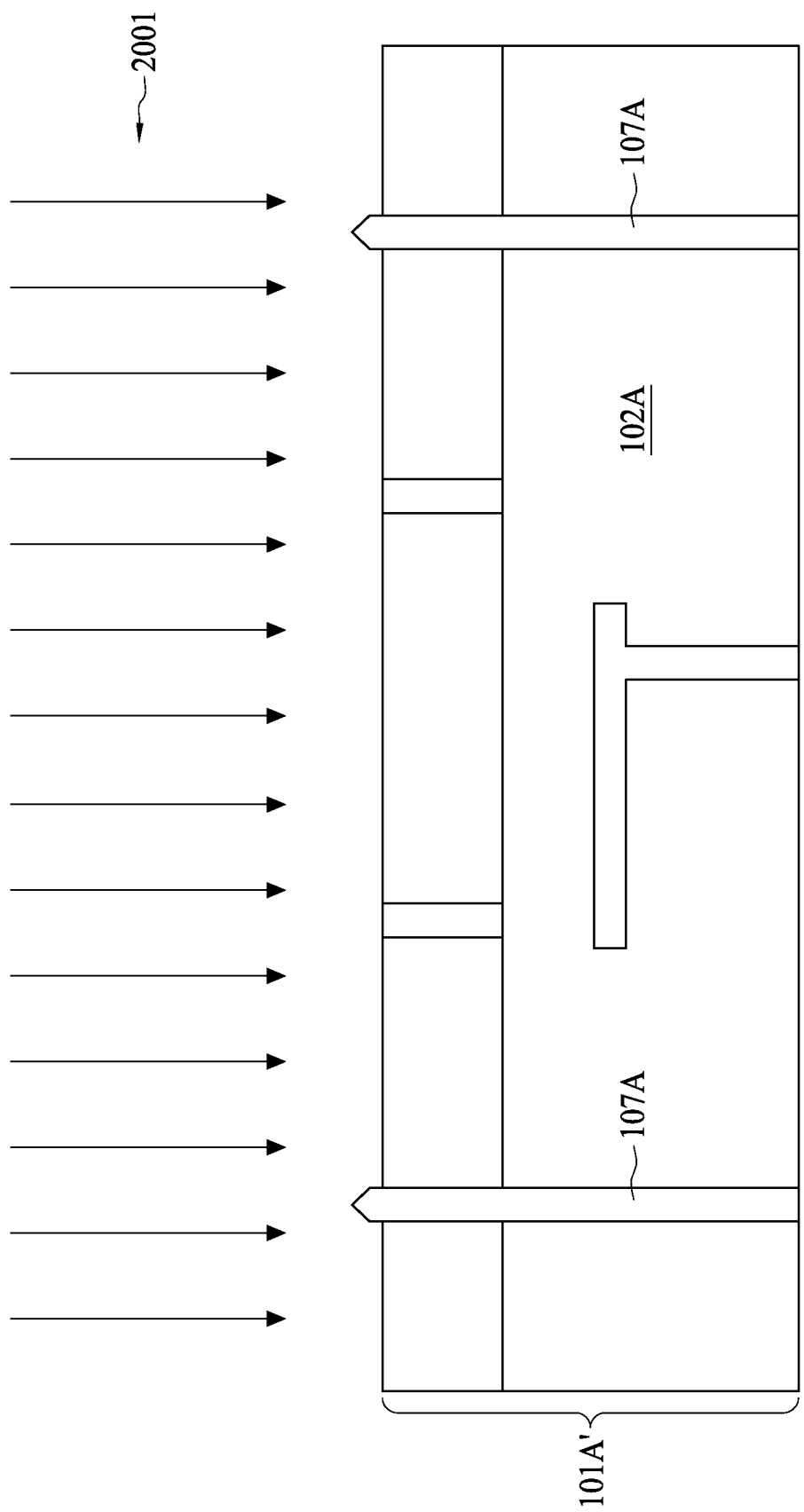
Figure 21:
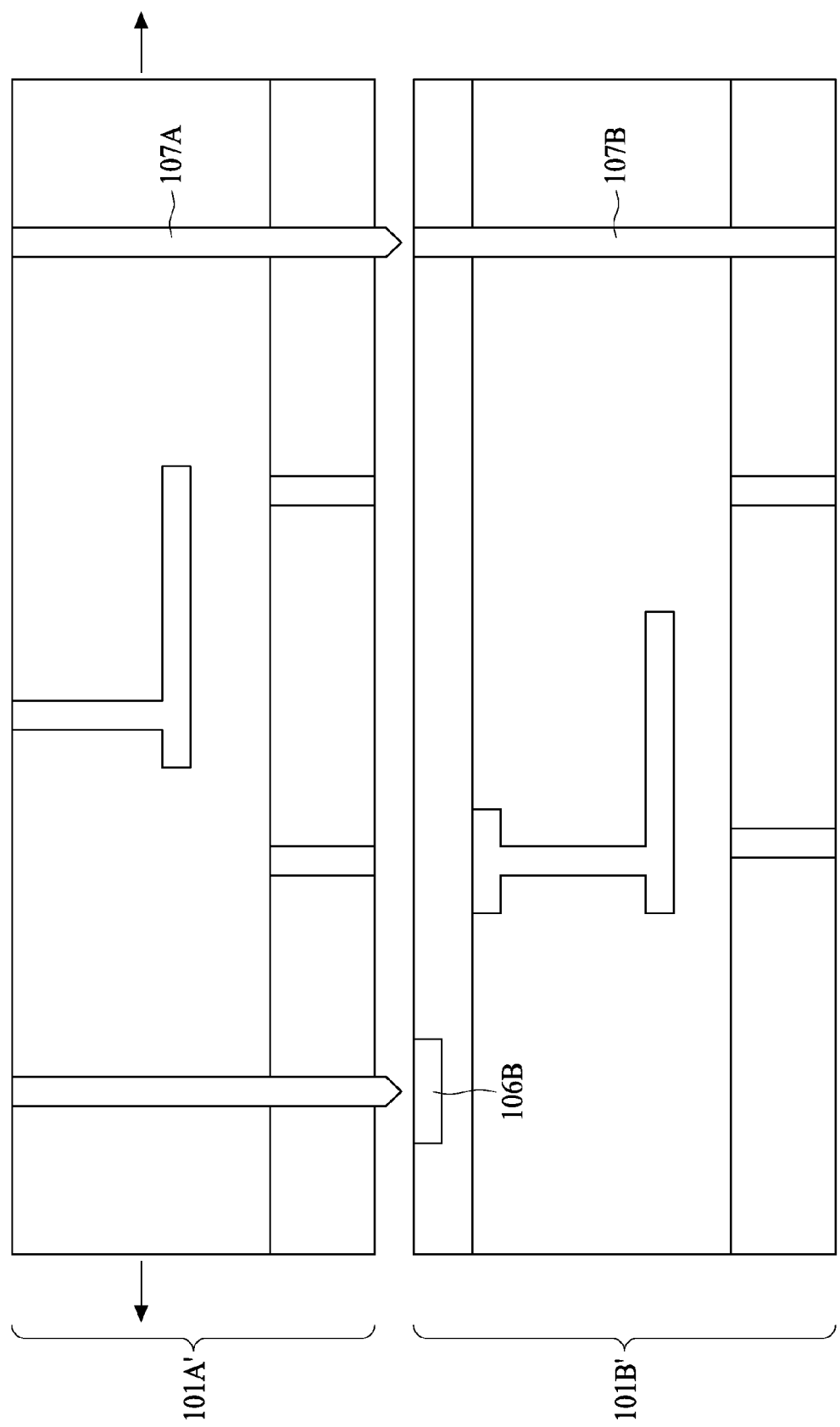

In FIG. 20, an etching operation 2001 is conducted over, for example, the first device 101A' and obtain the at least one tip feature over the first conductive component (i.e., the TDVs 107A) previously discussed. The etching operation 2001 can be referred to those described in FIG. 13 and FIG. 14 and is not repeated here for simplicity.

Prior to hybrid bond the first device 101A' and the second device 101B', a cleaning operation, such as to remove copper oxides over the exposed contact pad 106B or the TDVs 107A, 107B, may also be employed. Before any protection layer (not shown) is formed over the exposed contact pad 106B or the TDVs 107A, 107B, an oxide material may begin forming soon after a final fabrication step on top surfaces of the conductive pads 106B, depending on the manufacturing environment, for example, because Cu oxidizes easily. The oxide material may include copper oxide ($CuO_x$) for example, by exposure of the Cu conductive pads to oxygen in the ambient air. The oxide material may include other materials, depending on the type of material of the conductive pads 106B, for example. Removal of the oxide material from the top surfaces of the conductive pads 106B is important to achieve a high quality hybrid bond to another semiconductor substrate, to avoid high resistance connections between the devices.

The cleaning operation may include exposure to deionized (DI) $H_2O$, exposure to $NH_4OH$, exposure to diluted hydrofluoric acid (DHF) (e.g., at a concentration of less than about 1% HF acid), exposure to other acids, a cleaning process with a brush, a mega-sonic procedure, a spin process, exposure to an infrared (IR) lamp, or a combination thereof, as examples, although alternatively, the cleaning process may comprise other types of cleaning processes. The cleaning operation enhances a density of a hydroxy group disposed on top surfaces of the substrate in some embodiments. Enhancing the density of the hydroxy group on the substrate advantageously increases bonding strength and reduces the anneal temperature required for the hybrid bonding operation, for example. In some embodiments, a scrubbing operation shown in FIG. 21 can be optionally performed to remove the surface oxide of the conductive components. For example, the at least one tip feature on the first conductive component achieves better scrubbing effect with respect to removing the surface oxide of the conductive components on the counterpart device, compared to those first conductive components with nearly flat surfaces.

Figure 22:
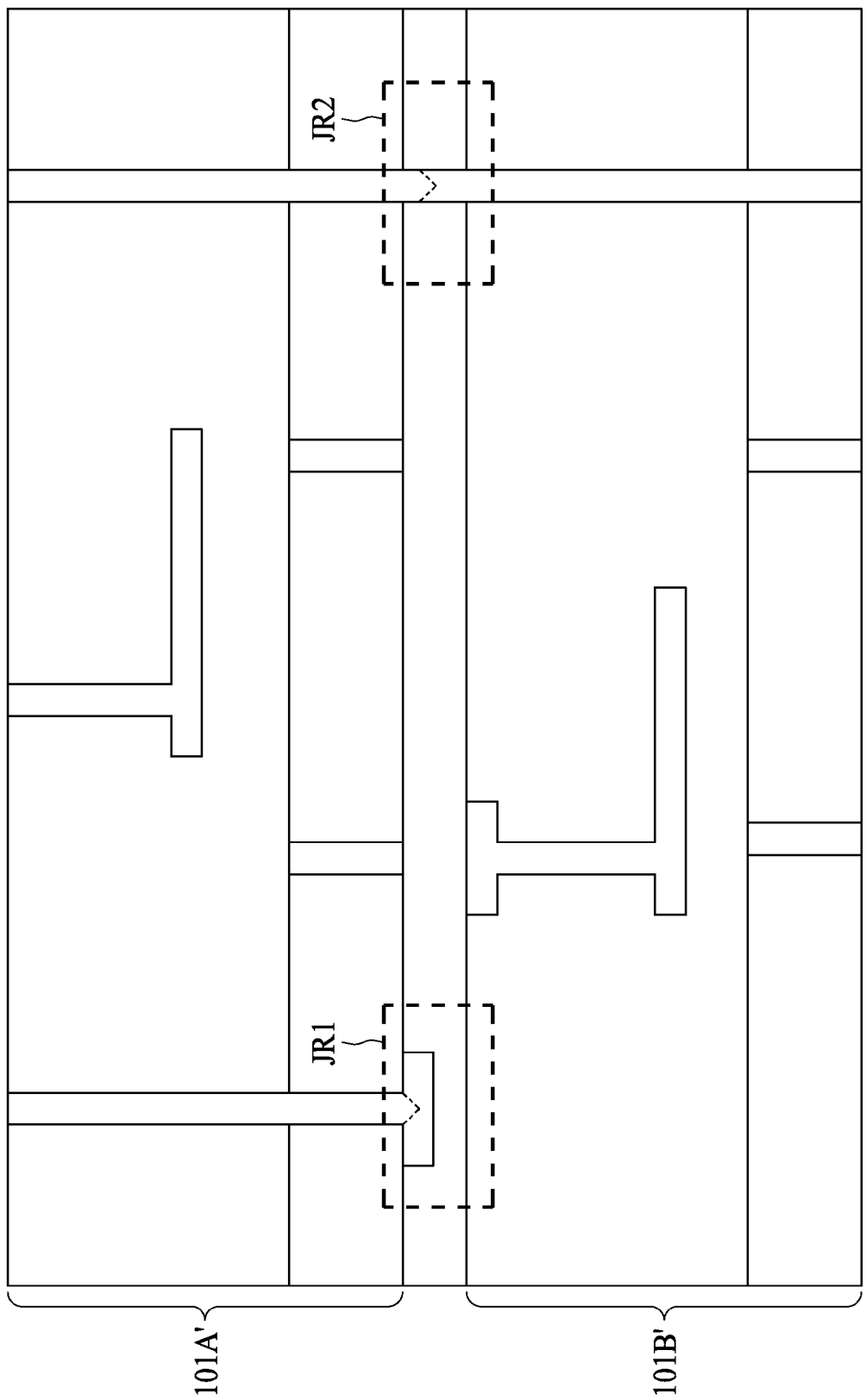

In FIG. 22, the first device 101A' is hybrid bonded to the second device 101B'. After the cleaning and alignment process of the devices 101A' and 101B', the devices 101A' and 101B' are hybrid bonded together by applying pressure and heat. The pressure applied may include a pressure of less than about 300 MPa, and the heat applied may include an anneal process at a temperature of from about 150 to about 300 degrees Celsius for a duration range from about 0.1 to 2 hours, as examples, although alternatively, other amounts of pressure and heat may be used for the hybrid bonding. Conventionally, the anneal process used in hybrid bonding includes two stages. One stage with lower temperature to fuse the dielectric-dielectric interface and the other stage with higher temperature to fuse the metal-metal interface. Normally the latter stage requires at least a temperature of about 300 degrees Celsius, which could be detrimental to previously-deposited low-k dielectric material. In the present disclosure, the annealing temperature adopted in the hybrid bonding operation can have an one-stage profile, for example, maintain the bonding temperature at about 200 degrees Celsius during the course of anneal process because the metal-to-metal bonding carried out with presently proposed at least one tip feature can be achieved at a lower temperature which does not harm the low-k dielectric material.

Dotted lines at the joint regions JR1, JR2 shown in FIG. 22 are schematic illustration of the plastic and/or elastic deformation of one of the conductive component in, for example, the first device 101A' that penetrates into the conductive component of the second device 101B'. In some embodiments, the conductive components of the first device 101A' and the second device 101B' can both possess the at least one tip feature as previously discussed for the joining operation depicted in FIG. 21 and FIG. 22.

The grain size of the Cu of the conductive pads 106B may comprise about 0.1 to 5 μm after the anneal process, with a bond strength larger than about 1.0 $J/m^2$ in an embodiment, for example. The hybrid bonding may be performed in a $N_2$ environment, an Ar environment, a He environment, an (about 4 to 10% $H_2$)/(about 90 to 96% inert gas or $N_2$) environment, an inert-mixing gas environment, combinations thereof, or other types of environments. The ambient environment in the chamber contains a minimal amount of or no amount of $O_2$, to prevent the oxidation of the conductive pads 106B before or during the hybrid bonding process, for example, in some embodiments.

Although in the present disclosure only two devices 101A', 101B' are stacked in a 3D-IC, a third device can be formed in the manner described above for the first and second devices. It should be understood that the stack can include two, three or more devices as dictated by the design and desired functionality, each device forming a hybrid bond with an adjacent device in the device stack. As described with the connection between the first two devices, the second and third devices are bonded together using a hybrid bond using both metal-to-metal and non-metal-to-non-metal bonds. These hybrid bonds between pairs of devices create a robust stack.

Some embodiments of the present disclosure provide a semiconductor package, including a first device having a first joining surface, a first conductive component at least partially protruding from the first joining surface, a second device having a second joining surface facing the first joining surface, and a second conductive component at least exposing from the second joining surface. The first conductive component and the second conductive component forming a joint having a first beak. The first beak points to either the first joining surface or the second joining surface.

Some embodiments of the present disclosure provide a method for manufacturing a semiconductor package, including (1) providing a first device having a first joining surface and a first conductive component at least partially protruding from the first joining surface; (2) providing a second device having a second joining surface and a second conductive component at least exposing from the second joining surface; (3) performing an etch over either the first conductive component or the second conductive component to obtain an uneven top surface of the first conductive component or the second conductive component; and (4) joining the first conductive component and the second conductive component.

Some embodiments of the present disclosure provide a method for manufacturing a hybrid bonded semiconductor package. The method includes (1) providing a first device having a first joining surface and a first conductive component at least partially protruding from the first joining surface, (2) providing a second device having a second joining surface and a second conductive component at least exposing from the second joining surface, (3) performing an etch over either the first conductive component or the second conductive component to obtain an uneven top surface of the first conductive component or the second conductive component, and (4) joining the first conductive component and the second conductive component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a first device having a first joining surface;
a first conductive component at least partially protruding from the first joining surface;
a second device having a second joining surface facing the first joining surface; and
a second conductive component at least exposing from the second joining surface,
wherein the first conductive component and the second conductive component forming a joint having a first beak contour and a second beak contour, the first beak contour having a tip at a first side of the joint, the tip at a first side of the joint pointing to either the first joining surface or the second joining surface, and the second beak contour having a tip at a second side of the joint, the tip at a second side of the joint pointing to either the first joining surface or the second joining surface.

2. The semiconductor package of claim 1, wherein the first device is selected from a group consisting essentially of a semiconductor wafer and a semiconductor chip.

3. The semiconductor package of claim 2, wherein the second device is selected from a group consisting essentially of a semiconductor wafer and a semiconductor chip.

4. The semiconductor package of claim 1, wherein the first conductive component is a through dielectric via (TDV) or a through silicon via (TSV).

5. The semiconductor package of claim 1, wherein a width of the first conductive component and a width of the second conductive component viewing from a cross section are different.

6. The semiconductor package of claim 1, wherein a width of the first conductive component viewing from a cross section is below 25 micrometer.

7. The semiconductor package of claim 1, wherein the first conductive component is a contact pad on the first joining surface.

8. The semiconductor package of claim 1, further comprising an underfill between the first joining surface and the second joining surface.

9. The semiconductor package of claim 1, an angle between an extension of the first beak contour and an extension of the second beak contour is in a range of from about 60 to about 170 degrees.

10. A method for manufacturing a semiconductor package, comprising:
providing a first device having a first joining surface and a first conductive component at least partially protruding from the first joining surface;
providing a second device having a second joining surface and a second conductive component at least exposing from the second joining surface;
performing an etch over either the first conductive component or the second conductive component to obtain an uneven top surface of the first conductive component or the second conductive component; and
joining the first conductive component and the second conductive component.

11. The method of claim 10, wherein the performing an etch comprises performing a copper wet etch, a copper dry etch, or a combination thereof.

12. The method of claim 11, wherein the copper wet etch at least comprises applying 1% $H_2SO_4$ for a duration of from about 10 to 180 seconds.

13. The method of claim 11, wherein the copper dry etch at least comprises an etching gas of Chlorine.

14. The method of claim 10, wherein the performing an etch over either the first conductive component or the second conductive component to obtain an uneven top surface of the first conductive component or the second conductive component comprises forming at least one tip on the top surface.

15. The method of claim 14, wherein the at least one tip on the top surface comprises an angle in a range of from about 60 to 170 degrees.

16. A method for manufacturing a hybrid bonded semiconductor package, comprising:
providing a first device having a first joining surface and a first conductive component at least partially protruding from the first joining surface;
providing a second device having a second joining surface and a second conductive component at least exposing from the second joining surface
performing an etch over either the first conductive component or the second conductive component to obtain at least one tip over a top surface of the first conductive component or a top surface of the second conductive component;
joining the first conductive component and the second conductive component under a constant temperature.

17. The method of claim 16, wherein the constant temperature is lower than 300 degrees Celsius.

18. The method of claim 16, wherein the performing the etch over either the first conductive component or the second conductive component to obtain at least one tip over a top surface of the first conductive component or the second conductive component comprising applying 1% $H_2SO_4$ until an angle of the tip being in a range of from about 60 to about 170 degrees.

19. The method of claim 16, wherein the first conductive component is a through silicon via (TSV) or a through dielectric via (TDV).

20. The method of claim 16, further comprising scrubbing the top of the first conductive component and the top surface of the second conductive component.

* * * * *